United States Patent
Jang et al.

(12)

(10) Patent No.: US 11,522,504 B2
(45) Date of Patent: Dec. 6, 2022

(54) WIDEBAND RF SHORT/DC BLOCK CIRCUIT FOR RF DEVICES AND APPLICATIONS

(71) Applicant: Wolfspeed, Inc., Durham, NC (US)

(72) Inventors: Haedong Jang, San Jose, CA (US); Madhu Chidurala, Los Altos, CA (US); Richard Wilson, Morgan Hill, CA (US)

(73) Assignee: Wolfspeed, Inc., Durham, NC (US)

( * ) Notice: Subject to any disclaimer, the term of this patent is extended or adjusted under 35 U.S.C. 154(b) by 68 days.

(21) Appl. No.: 16/913,374

(22) Filed: Jun. 26, 2020

(65) Prior Publication Data

US 2021/0408977 A1   Dec. 30, 2021

(51) Int. Cl.
*H03F 3/19*      (2006.01)
*H03F 3/24*      (2006.01)
*H03L 7/099*     (2006.01)

(52) U.S. Cl.
CPC .............. *H03F 3/19* (2013.01); *H03F 3/245* (2013.01); *H03L 7/099* (2013.01); *H03F 2200/451* (2013.01)

(58) Field of Classification Search
CPC ...... H03F 3/19; H03F 3/245; H03F 2200/451; H03L 7/099
USPC ....................................................... 330/295
See application file for complete search history.

(56) References Cited

U.S. PATENT DOCUMENTS

| | | | | |
|---|---|---|---|---|
| 6,466,094 | B2 * | 10/2002 | Leighton | ................. H03F 1/565 330/302 |
| 7,786,603 | B2 * | 8/2010 | Piel | ......................... H01L 25/16 257/784 |
| 10,122,336 | B1 * | 11/2018 | Jang | ......................... H03F 1/56 |
| 2002/0125955 | A1 * | 9/2002 | Leighton | ................. H03F 1/565 330/302 |
| 2015/0381117 | A1 * | 12/2015 | Shah | ......................... H03F 1/30 330/307 |
| 2016/0336907 | A1 * | 11/2016 | Gorbachov | ............. H03F 3/195 |
| 2018/0026000 | A1 * | 1/2018 | De Boet | ................. H01L 24/49 333/32 |
| 2019/0044483 | A1 * | 2/2019 | Arigong | ................. H03F 1/565 |
| 2019/0165753 | A1 * | 5/2019 | Arigong | ................. H03F 3/193 |
| 2019/0356274 | A1 * | 11/2019 | Zhu | ........................ H01L 24/49 |
| 2019/0356284 | A1 * | 11/2019 | Zhu | ........................ H03F 1/565 |
| 2020/0059204 | A1 * | 2/2020 | Kahloon | ............ H01L 21/4853 |
| 2020/0204119 | A1 * | 6/2020 | Roberts | ................. H03F 1/0288 |
| 2020/0204122 | A1 * | 6/2020 | Zhu | ........................ H03F 3/193 |
| 2020/0366257 | A1 * | 11/2020 | Roiz | ..................... H03F 1/3205 |

(Continued)

*Primary Examiner* — Hafizur Rahman
(74) *Attorney, Agent, or Firm* — Myers Bigel, P.A.

(57) ABSTRACT

Inductance-capacitance (LC) resonators having different resonant frequencies, and radio frequency (RF) transistor amplifiers including the same. One usage of such LC resonators is to implement RF short/DC block circuits. A RF transistor amplifier may include a transistor on a base of the RF transistor amplifier coupled to an input and an output of the RF transistor amplifier; a first inductance-capacitance (LC) resonator comprising a first inductance and a first capacitance; and a second LC resonator comprising a second inductance and a second capacitance. The first LC resonator may be configured to resonate at a first frequency, and the second LC resonator may be configured to resonate at a second frequency different from the first frequency.

20 Claims, 15 Drawing Sheets

(56) References Cited

U.S. PATENT DOCUMENTS

2021/0126593 A1* 4/2021 Roberts .................. H03F 1/565
2021/0202408 A1* 7/2021 Khalil .................... H01L 24/49

* cited by examiner

WIDEBAND RF SHORT/DC BLOCK CIRCUIT FOR RF DEVICES AND APPLICATIONS

FIELD

This present disclosure relates generally to radio frequency ("RF") power devices and, more particularly, to RF devices and applications having a wideband RF short circuit to ground that blocks direct current (DC) signals.

BACKGROUND

RF amplifiers are used in a variety of applications such as, for example, as high power and/or low noise amplifiers in base stations for wireless communication systems. The RF signals amplified by these amplifiers typically include signals that have a modulated carrier having frequencies in the megahertz ("MHz") to gigahertz ("GHz") frequency range. The baseband signal that modulates the carrier is typically at a relatively lower frequency and, depending on the application, can be up to 300 MHz or higher. Many RF amplifier designs utilize semiconductor switching devices as amplification devices. Examples of these switching devices include power transistor devices, such as MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc.

Packaged RF devices typically include a transistor die mounted on a base and enclosed in a package. An RF input signal is supplied to the transistor through an RF input lead that extends from outside the package to the inside of the package, and an RF output signal is delivered from the device through an RF output lead that extends from inside the package to the outside.

RF short/DC block circuits are commonly used in RF transistor amplifiers. A common example in RF transistor amplifier is using a metal-oxide-semiconductor capacitor (MOSCAP) as a DC blocking capacitor. Unfortunately, however, the DC blocking capacitor has an associated inherent parasitic inductance. If the parasitic inductance is non-negligible at RF frequencies, the capacitance and the parasitic inductance must be carefully selected to resonate at the selected RF frequencies of interest to ensure that the DC blocking capacitor does not interfere with proper operation of the RF device. RF short/DC block circuits may also be used in matching circuits such as impedance matching or harmonic termination circuits. In these applications, the RF short/DC block circuit may be implemented, for example, as a series inductor-capacitor or "series LC" circuit. The capacitor of the series LC circuit may be implemented, for example, as a MOSCAP or other surface mount capacitor chip, and the inductor of the series LC circuit may be implemented as one or more bond wires. A first terminal of the capacitor is attached to electrical ground. In many RF amplifier designs, the RF transistor die is mounted on a base in the form of a metal flange or block that is connected to an electrical ground reference, and the first terminal of the capacitor may be connected to the metal flange/block. The second terminal of the capacitor is connected by the bonding wires to another portion of the device. The bond wires act as an inductor. A capacitance value of the capacitor may be selected to provide low or lower impedance at selected RF frequencies while blocking DC currents and/or providing high or higher impedance at low frequencies.

SUMMARY

Pursuant to some embodiments of the present invention, a radio frequency (RF) transistor amplifier is provided. The RF transistor amplifier may include a transistor on a base of the RF transistor amplifier coupled to an input and an output of the RF transistor amplifier; a first inductance-capacitance (LC) resonator comprising a first inductance and a first capacitance; and a second LC resonator comprising a second inductance and a second capacitance. The first LC resonator may be configured to resonate at a first frequency, and the second LC resonator may be configured to resonate at a second frequency different from the first frequency.

In some embodiments, the first inductance may include a first bond wire and the second inductance may include a second bond wire. The first bond wire and the second bond wire may be different in length, profile, and/or cross-sectional area. The first bond wire and the second bond wire may have different cross-section shapes. The first bond wire may have a first value for a selected characteristic, and the second bond wire may have a second value for the selected characteristic that is different from the first value.

In some embodiments, the first capacitance may have a capacitance value that differs from a capacitance value of the second capacitance.

In some embodiments, the first capacitance may have a capacitance value that differs from a capacitance value of the second capacitance, and the first inductance may be equal to the second inductance.

In some embodiments, the first capacitance may have a capacitance value that differs from a capacitance value of the second capacitance, and the first inductance may include a first bond wire and the second inductance may include a second bond wire. The first bond wire and the second bond wire may be different in length, material, profile, and/or cross-sectional area. The first bond wire and the second bond wire may have different cross-section shapes.

In some embodiments, the first inductance is different from the second inductance, and wherein the first capacitance is equal to the second capacitance.

In some embodiments, a segmented capacitor may include the first capacitance and the second capacitance.

In some embodiments, the first and second LC resonators may be coupled to the input of the RF transistor amplifier. In some embodiments, the first and second LC resonators may be coupled to the output of the RF transistor amplifier.

In some embodiments, the RF transistor amplifier may include a plurality of LC resonators that includes the first and second LC resonators. The plurality of LC resonators may be configured collectively to attenuate RF signals across a frequency band. For example, the first frequency may be below a central frequency of the frequency band, and the second frequency may be above the central frequency of the frequency band. The central frequency of the frequency band may be at least 500 MHz. The central frequency of the frequency band may be at least 2 GHz.

In some embodiments, the transistor may be a laterally diffused metal oxide semiconductor (LDMOS). In some embodiments, the transistor may be high electron mobility transistors (HEMT).

Pursuant to some embodiments of the present invention, a radio frequency (RF) transistor amplifier is provided. The RF transistor amplifier may include a transistor on a base of the RF transistor amplifier coupled to an input and an output of the RF transistor amplifier; a first inductance-capacitance (LC) resonator including a first set of inductive bond wires and a first capacitance; and a second LC resonator including a second set of inductive bond wires and a second capacitance. The first LC resonator may be configured to resonate at a first frequency, and the second LC resonator may be configured to resonate at a second frequency different from the first frequency.

In some embodiments, the first set of inductive bond wires and the second set of inductive bond wires may be different in length, material, profile, and/or cross-sectional area. The first set of inductive bond wires and the second set of inductive bond wires may have different cross-section shapes. The first set of bond wires may have a first value for a selected characteristic, and wherein the second set of bond wires may have a second value for the selected characteristic that is different from the first value, resulting in the first set of bond wires having a first inductance and the second set of bond wires having a second inductance.

In some embodiments, a segmented capacitor may include the first capacitance and the second capacitance.

In some embodiments, the first capacitance and second capacitance may have different capacitance values.

In some embodiments, the first and second LC resonators may be coupled to the output of the RF transistor amplifier.

In some embodiments, the RF transistor amplifier may include a plurality of LC resonators that includes the first and second LC resonators, and the plurality of LC resonators may be configured collectively to attenuate RF signals across a frequency band. For example, the first frequency may be below a central frequency of the frequency band, and the second frequency may be above the central frequency of the frequency band. The central frequency of the frequency band may be at least 500 MHz. The central frequency of the frequency band may be at least 2 GHz.

In some embodiments, the transistor may be a laterally diffused metal oxide semiconductor (LDMOS). In some embodiments, the transistor may be a high electron mobility transistor (HEMT).

Pursuant to some embodiments of the present invention, a radio frequency (RF) transistor amplifier is provided. The RF transistor amplifier may include a transistor on a base of the RF transistor amplifier coupled to an input and an output of the RF transistor amplifier; and an output circuit configured to attenuate RF signals across a frequency band. The output circuit may include a plurality of inductance-capacitance (LC) resonators, each coupled to an output of the RF transistor amplifier, and each configured to resonate at a respective different frequency.

In some embodiments, a first LC resonator of the plurality of LC resonators may be configured to resonate at a first frequency below a central frequency of the frequency band, and a second LC resonator of the plurality of LC resonators may be configured to resonate at a second frequency above the central frequency of the frequency band.

In some embodiments, the plurality of LC resonators may include at least three LC resonators.

In some embodiments, each LC resonator may include a respective set of inductive bond wires. The inductive bond wires of each set of inductive bond wires may differ in length, material, profile, and/or cross-sectional area from the inductive bond wires of the other sets of inductive bond wires. Each inductive bond wire of a first set of inductive bond wires may have a first cross-section shape, and each inductive bond wire of a second set of inductive bond wires may have a second cross-section shape different from the first cross-section shape. Each inductive bond wire of a first set of inductive bond wires may have a first length, and each inductive bond wire of a second set of inductive bond wires may have a second length different from the first length.

In some embodiments, the transistor may be a laterally diffused metal oxide semiconductor (LDMOS). In some embodiments, the transistor may be a high electron mobility transistor (HEMT).

DETAILED DESCRIPTION

Figure 10:
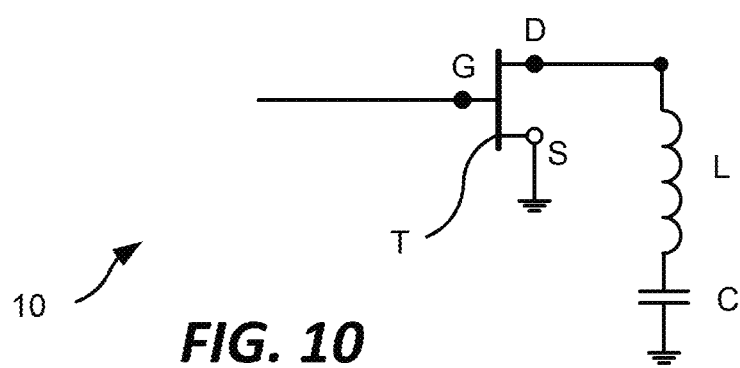
FIG. 10 is a simple schematic circuit diagram of an RF transistor amplifier.

RF transistor amplifiers may use bond wires to connect the RF transistor amplifier die to package leads, impedance matching circuits, and/or harmonic termination circuits. These bond wires have an inherent inductance that may be used to provide at least some of the inductance of the impedance matching and/or harmonic termination circuits of the RF transistor amplifiers. Additionally, a section of transmission line in series with the bond wires may also have an inherent inductance. The impedance matching circuits and/or harmonic termination circuits that are included in RF transistor amplifiers may be designed to provide a path to ground for RF signals in selected frequency ranges, while blocking DC currents and RF signals in other frequency ranges from passing to ground. The amount of inductance provided by a bond wire will vary with, among other things, the length and cross-sectional area (e.g., the diameter) of the bond wire. As bond wires can provide inductance, one way to implement an RF short/DC block is using a series LC resonator. One or more bonding wires behaving as an inductor can resonate with a coupled capacitor (e.g., a MOSCAP) to provide DC blocking and/or an RF short at a desired frequency. For example, FIG. 10 is a simple circuit schematic 10 illustrating a transistor T which has a LC resonator circuit coupled to its output lead.

The resonant frequency of an LC resonator can be described via the equation:

$$f = \frac{1}{2\pi\sqrt{L \times C}}$$

where f is the resonant frequency, L is the inductance, and C is the capacitance.

Conventionally, the LC resonators used in RF transistor amplifiers have been designed to resonate only at a target frequency. This results in narrow bandwidth which may not be sufficient for certain applications. Additionally, design of such conventional LC resonators has typically begun with a predetermined capacitance value, since there is a greater amount of flexibility in the design of bond wires than in the design of a MOSCAP (which may be a purchased part and only available at discrete capacitance levels). Conventionally, bond wires having uniform characteristics have been used in these RF transistor amplifiers. In other words, a number of identical bond wires have conventionally been provided, with each of the bond wires having the same length, shape, cross-section, material, and so on.

Figure 8:
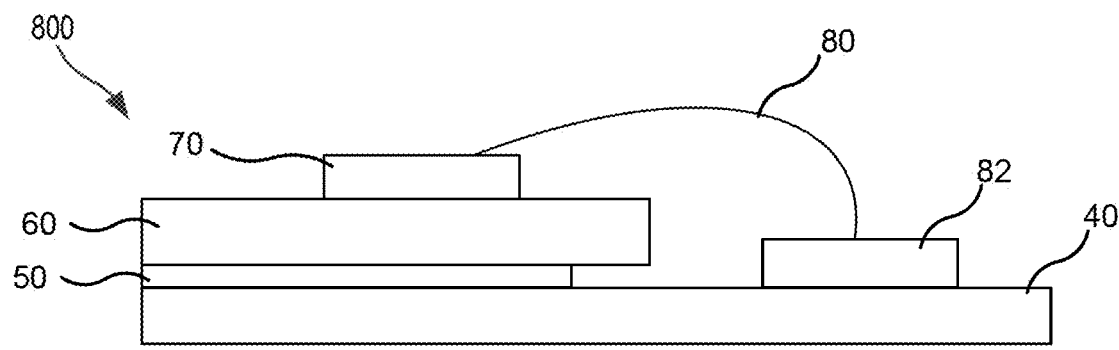
FIG. 8 is a schematic cross-sectional view of a portion of a conventional RF transistor amplifier.

FIG. 8 is a schematic cross-sectional view of a portion of a conventional RF transistor amplifier 800. In the conventional RF transistor amplifier 800, a heat sink metal 40 may be provided that is used to exhaust heat generated in the RF transistor amplifier die (not shown) of RF transistor amplifier 800. A printed circuit board or similar structure that has a bottom metal layer 50, dielectric material 60, and a top metal trace 70 stacked sequentially thereon is mounted on the heat sink metal 40. The top metal trace defines an RF transmission line in the printed circuit board or similar structure, and this RF transmission line may be electrically connected to the RF transistor amplifier die. A capacitor (e.g., MOSCAP) 82 may also be mounted on the heat sink metal 40. A plurality of bond wires 80 of identical length and uniform characteristics may connect the top metal trace 70 to the capacitor 82 (only one of which is visible in the schematic side view of FIG. 8). Each of the plurality of bond wires provides an identical inductance, which, when coupled in series with the capacitor 82, results in a plurality of LC resonators each having a same resonant frequency.

Pursuant to embodiments of the present invention, RF short/DC block circuits having a greater bandwidth than conventionally designed LC resonators are provided. Thus, pursuant to embodiments of the present invention, RF transistor amplifiers are provided in which broadband RF short/DC block circuits are implemented by a first series LC resonator comprising a first inductance and a first capacitance and a second series LC resonator comprising a second inductance and a second capacitance. The first series LC resonator is configured to resonate at a first frequency, and wherein the second series LC resonator is configured to resonate at a second frequency different from the first frequency. The first and second inductances may be different from each other, and/or the first and second capacitances may be different from each other.

Figure 9A:
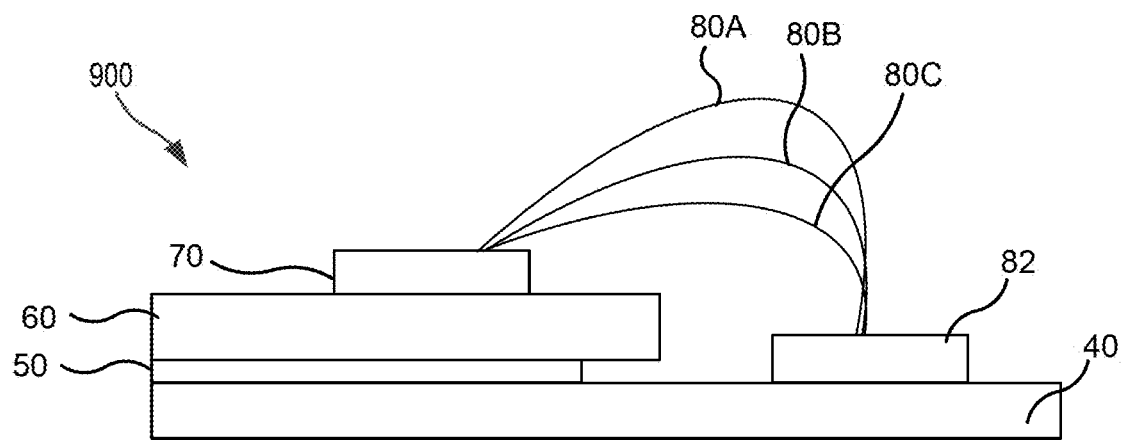
FIGS. 9A and 9B are schematic cross-sectional views of portions of RF transistor amplifiers according to embodiments of the present invention.
Figure 9B:
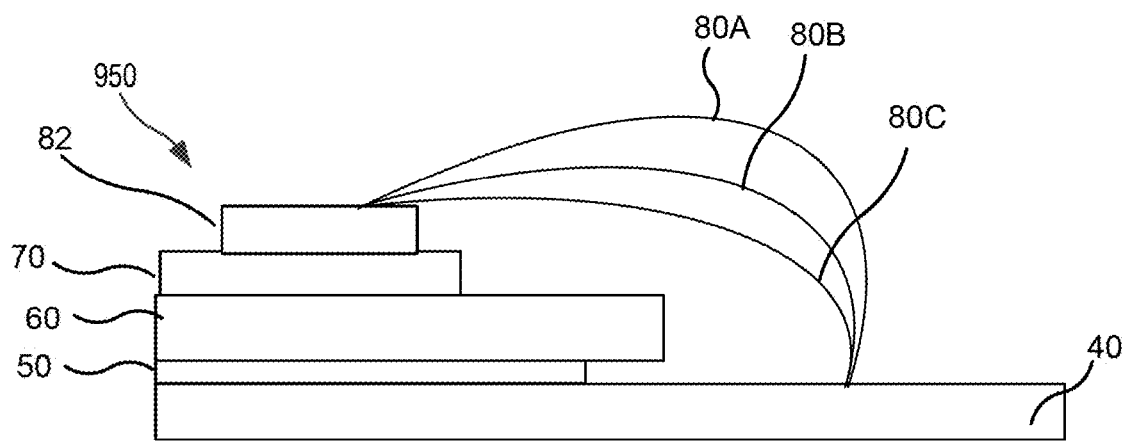

FIG. 9A is a schematic cross-sectional view of a portion of an RF transistor amplifier 900 according to certain embodiments of the present invention. In the RF transistor amplifier 900, as compared to the RF transistor amplifier 800 of FIG. 8, bond wires 80A, 80B, and 80C of differing lengths may connect the top metal trace 70 to the capacitor 82. As each bond wire provides a different inductance, each bond wire, when coupled in series with the capacitor 82, results in a plurality of series LC resonators each having a different resonant frequency. As can be seen in FIG. 9B, in certain embodiments of the present invention, in a RF transistor amplifier 950, as compared to the RF transistor amplifier 900 of FIG. 9A, bond wires 80A, 80B, and 80C of differing lengths may connect a capacitor 82 stacked on the top metal trace 70 to the heat sink metal 40.

Although the series LC resonators provided herein are presented within the context of RF short/DC block circuits, the present disclosure is not limited thereto. Embodiments of the present invention may have applicability to input and output harmonic reducers, as well as in impedance matching, and may provide bond wires and/or capacitances which have different characteristics and/or are designed to work at multiple frequencies, which may provide wider bandwidth.

Some embodiments provide packaged RF transistor devices, specifically including RF transistors amplifiers. RF transistor devices typically include a plurality of transistor cells operating in parallel. Transistors that can be included in devices according to embodiments of the invention can include metal-oxide-semiconductor field-effect transistors (MOSFETs), including laterally diffused MOSFETs (LDMOSFETs) or other semiconductor devices, such as bipolar devices, metal-semiconductor FET (MESFET) devices, heterojunction bipolar transistor (HBT) devices, and high-electron-mobility transistor (HEMT) devices. The transistors can be made using narrow or wide bandgap semiconductors. For example, the transistors can include silicon LDMOS and/or bipolar transistors, and/or III-V devices such as GaAs MESFETs, InGaP HBTs, GaN HEMT devices, GaN bipolar transistors, etc.

Figure 1A:
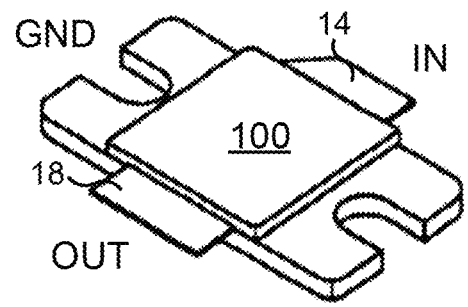
FIG. 1A is a perspective view of an example RF transistor amplifier 100.
Figure 1B:
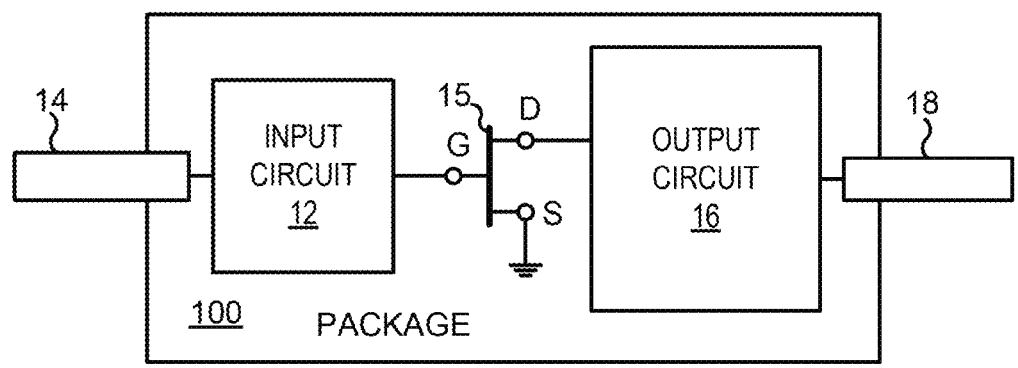
FIG. 1B is a functional block diagram of an example layout of the RF transistor amplifier 100 of FIG. 1A.

FIG. 1A is a perspective view of an example RF transistor amplifier 100. FIG. 1B is a functional block diagram of an example layout of the RF transistor amplifier 100 of FIG. 1A.

Referring to FIGS. 1A and 1*i*, the RF transistor amplifier 100 includes a transistor 15. The transistor may be a FET or bipolar device, for example but, for purposes of illustration, is shown as being a FET in FIG. 1B and will be described as such below. The RF transistor amplifier 100 may include an input circuit 12 connecting an input lead 14 to a control electrode of the transistor 15 (e.g., a gate G of a FET or base of a bipolar transistor). The transistor 15 may be a large periphery RF transistor including a plurality of transistor cells that are electrically connected in parallel. An output lead 18 may be connected to an output electrode of the transistor 15 (e.g., the drain D of a FET or the collector or emitter of a bipolar transistor). The RF input lead 14 and the output lead 18 may extend outside a package material of the RF transistor amplifier 100, as shown in FIG. 1A. In some embodiments, the source S of the transistor 15 may be electrically connected to ground.

As illustrated in FIG. 1B, an input circuit 12 may be provided within the RF transistor amplifier 100. According to some embodiments of the present invention, the input circuit 12 of the RF transistor amplifier 100 may include one or more capacitors and/or inductive elements to provide impedance matching to the input lead 14 of the RF transistor amplifier 100. In some embodiments, the input circuit 12 may include circuit elements for harmonic reduction. Bond wire connections may be provided from the one or more capacitors to respective cells (or groups of cells) of a transistor 15 (e.g., a multi-cell RF transistor die).

An output circuit 16 can also be provided inside the RF transistor amplifier 100. The output circuit 16 may include impedance matching elements and/or a harmonic reducer so that harmonic reduction can occur before the signal reaches the output lead 18. For example, the impedance matching elements may provide capacitive and/or inductive elements to match an impedance as seen at the output lead 18. The output circuit 16 may include a series LC circuit acting as an RF short/DC blocking element. Placing the output circuit 16 inside the package (versus outside the package) may improve the performance of the output matching circuit 16 across a broad range of frequencies and/or output power levels.

For purposes of convenience, the configuration of FIG. 1B will be discussed as an example, but the present inventive concepts may be equally applied to other configurations of circuits at either the input or output of the transistor 15. As used herein, an input circuit refers to any circuit that is between (e.g., electrically coupled between) the input lead and the transistor of a RF transistor amplifier that is used to modify an input to the RF transistor amplifier, such as through impedance matching and/or harmonic reduction. As used herein, an output circuit refers to any circuit that is between (e.g., electrically coupled between) the transistor and the output lead of the RF transistor amplifier that is used to modify an output of the RF transistor amplifier, such as through impedance matching and/or harmonic reduction.

Figure 2A:
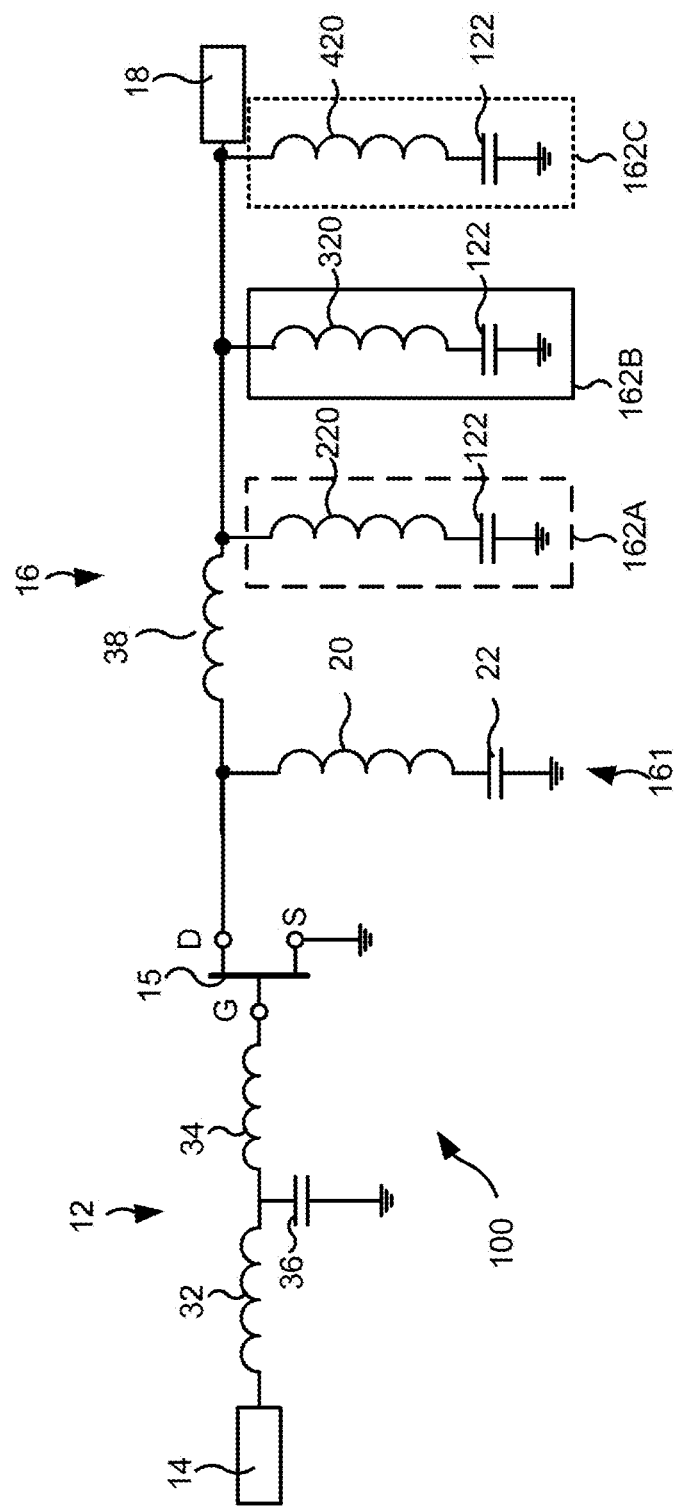
FIG. 2A is a schematic circuit diagram of an RF transistor amplifier according to embodiments of the present invention.
Figure 2B:
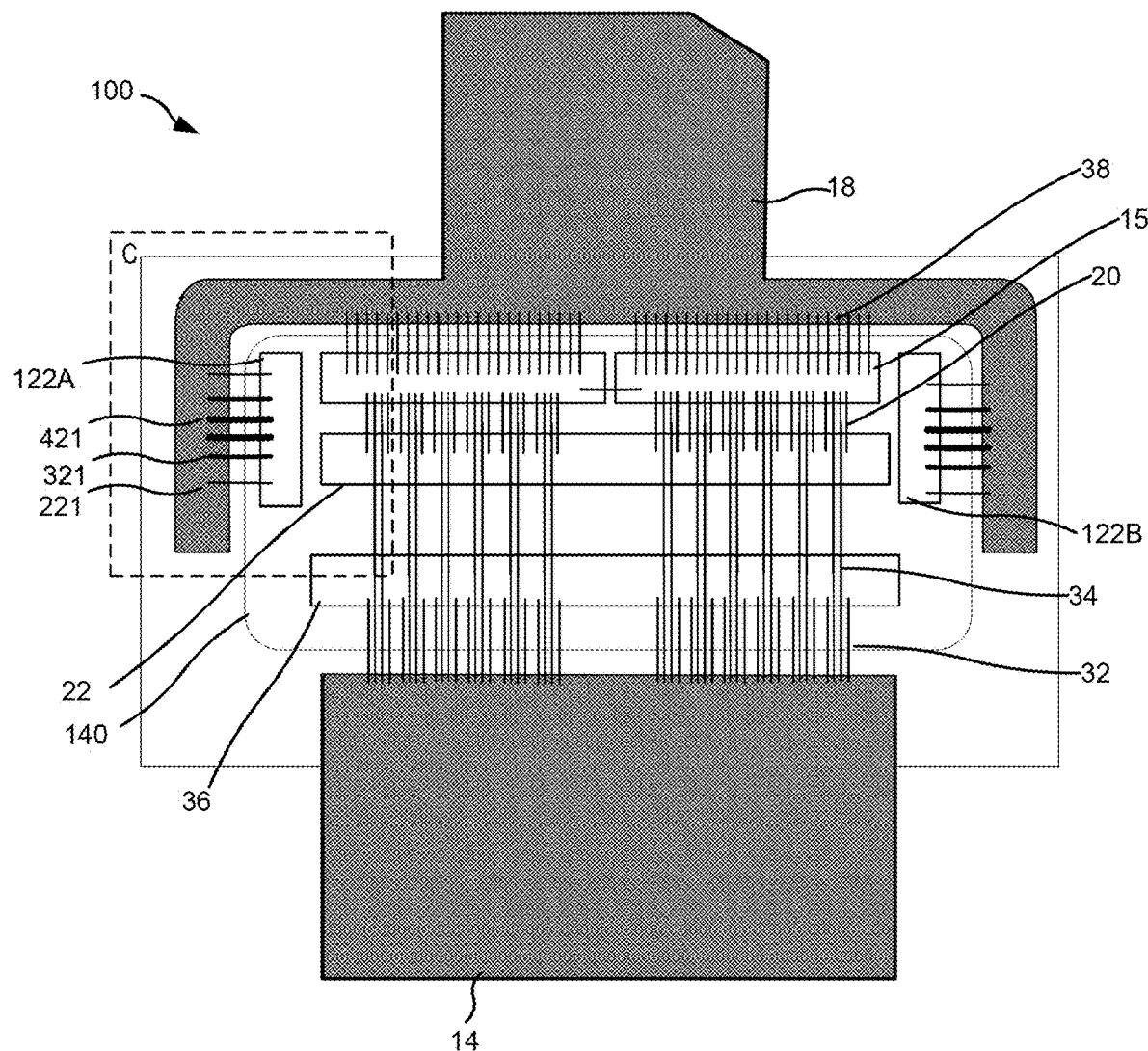
FIG. 2B is an example physical layout of the RF transistor amplifier that is illustrated in FIG. 2A.
Figure 2C:
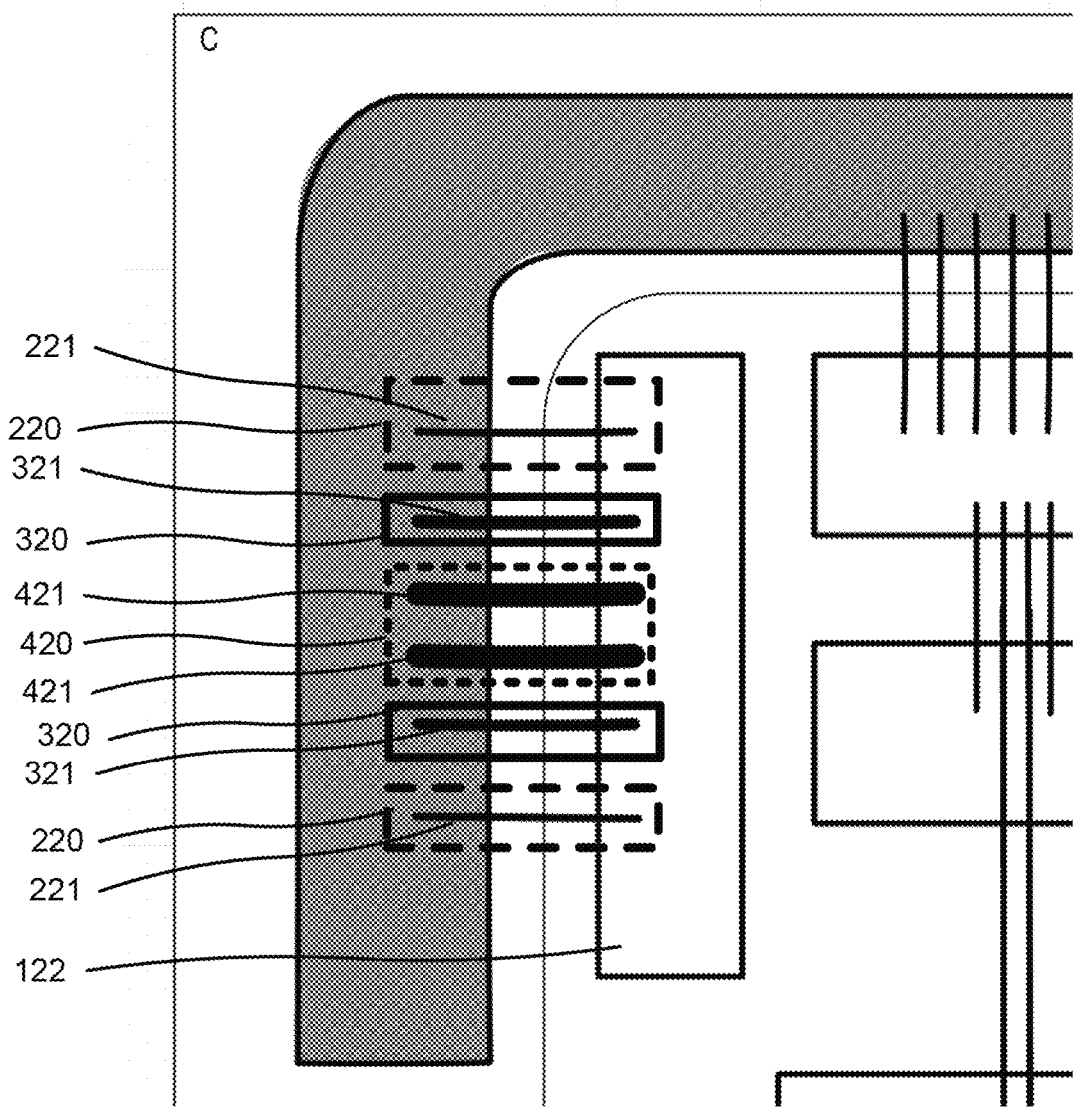
FIG. 2C is an enlarged view of a portion C of the example physical layout of the RF transistor amplifier that is illustrated in FIG. 2B.

FIG. 2A is a schematic circuit diagram of an RF transistor amplifier 100 including a transistor 15, an input circuit 12, and an output circuit 16 according to embodiments of the present invention. The RF transistor amplifier 100 may be the RF transistor amplifier 100 of FIG. 1B. FIG. 2B is an example physical layout of the RF transistor amplifier 100 that is illustrated in FIG. 2A. FIG. 2C is an enlarged view of a portion C of the example physical layout of the RF transistor amplifier 100 that is illustrated in FIG. 2B.

Referring to FIGS. 2A-2C, an input circuit 12 may be connected between an input lead 14 and a gate G of the transistor 15. The input circuit 12 may include an inductive wire bond connection including one or more bond wires 32 extending between the input lead 14 and a first terminal of a capacitor 36, and an inductive wire bond connection including one or more bond wires 34 extending from the first terminal of the capacitor 36 to the gate G of the transistor 15. The capacitor 36 may be formed or mounted on a base 140 of the RF transistor amplifier 100 between the transistor 15 and the input lead 14. The base 140 may be electrically connected to ground, and a second terminal of the capacitor 36 may be mounted on the base so that the capacitor is coupled in series to ground. The inductance of the bond wires 32 and the bond wires 34, and the capacitance of the capacitor 36 may be selected so as to match an impedance of an external RF transmission line that is connected to the input lead 14 with an internal impedance of the RF transistor amplifier 100.

The source S of the transistor 15 may be grounded, and an output lead 18 may be connected to the drain D of the transistor 15 via an inductive wire bond connection including one or more bond wires 38 that extends from the drain D of the transistor to the output lead 18.

The RF transistor amplifier 100 may also include an output circuit 16 that is connected between the drain D of the transistor 15 and ground. In the embodiment illustrated in FIG. 2A, the output circuit 16 includes a harmonic reducer 161 that comprises an inductive element (e.g., one or more inductive bond wires) 20 in series with a capacitor 22. The capacitor 22 is connected to ground. The capacitor 22 may, for example, be mounted on the grounded base 140 of the RF transistor amplifier 100 adjacent the transistor 15. The one or more inductive bond wires 20 may include a bond wire 20 extending from, for example, the drain D of the transistor 15 (e.g., a drain terminal) to a first terminal that is on an upper side of the capacitor 22. The second terminal of capacitor 22 may on the lower surface thereof so that the second terminal is electrically connected to the grounded base 140. In some embodiments (not shown), the capacitor 22 may be mounted between the transistor 15 and the output lead 18 and the inductive bond wire 38 may pass over or beside the capacitor 22. As shown in FIG. 2B, in other embodiments the capacitor 22 may be mounted between the transistor 15 and the capacitor 36, and the inductive bond wire 34 may pass over the capacitor 22.

It will be appreciated that the base 140 of the RF transistor amplifier 100 can refer to any structural member on which the transistor 15 is mounted, and accordingly can correspond to a substrate, flange, die carrier, or the like.

Also present within the output circuit 16 of the embodiment illustrated in FIGS. 2A-2C are three RF short/DC block circuits 162A, 162B, and 162C. Each of the RF short/DC block circuits 162A, 162B, and 162C may include a series LC resonator that includes a common or shared capacitance 122 that is electrically coupled in series with respective inductive elements 220, 320, and 420, each providing a different inductance. Although the embodiment illustrated in FIGS. 2A-2C shows three RF short/DC block circuits, the present disclosure is not limited thereto, and there may be two, or more than three RF short/DC block circuits, each having an inductive element that provides a different amount of inductance.

For example, as best seen in FIG. 2C, the inductive element 220 may include one or more inductive bond wires 221, the inductive element 320 may include one or more inductive bond wires 321, and the inductive element 420 may include one or more inductive bond wires 421. Each of the inductive bond wires 221 may have one or more characteristics that differ from the characteristics of the inductive bond wires 321 and/or the characteristics of the inductive bond wires 421. For example, a number of inductive bond wires, a length of each inductive bond wire, a cross-section shape (e.g., profile or shape profile), a material of each inductive bond wire, and/or the like may differ.

According to the present disclosure, the capacitance of the common capacitance 122 may be considered as a combined capacitance of multiple (N) small virtual section capacitances $C_{section}$. Therefore, the total capacitance C may be considered $N \times C_{section}$, where N is the number of small virtual sections of the capacitance 122, and $C_{section}$ is the capacitance of each small virtual section of the capacitance 122.

If each individual bond wire inductance 221, 321, and 421, is designed to be identical, then each LC resonator (that is, each individual inductance $L_{individual}$ in series with a respective capacitance $C_{section}$) has an identical resonant frequency:

$$f_{individual} = \frac{1}{2\pi \sqrt{L_{individual} \times C_{section}}}$$

However, if the inductive bond wires 221, 321, and 421 are designed with differing characteristics, than each inductive element 220, 320, and 420 has a different inductance. As such, each LC resonator, and thus each RF short 162A, 162B, and 162C, may have a different resonant frequency.

$$f_A = \frac{1}{2\pi \sqrt{L_A \times C_{section}}}, f_B = \frac{1}{2\pi \sqrt{L_B \times C_{section}}},$$
$$\dots f_j = \frac{1}{2\pi \sqrt{L_j \times C_{section}}},$$

Thus, according to the present disclosure, by providing inductive bond wires with different characteristics, such as different lengths, different cross-section shapes (e.g., profile or shape profile), different materials, and/or the like, RF short/DC block circuits having different resonant frequencies may be provided.

In some embodiments, the inductive bond wires 221, 321, and 421 may be grouped to have the same resonant frequency. Herein, a group of two or more inductive bond wires having similar or identical characteristics and designed to have the same or similar resonant frequency may be referred to as a "bond wire group." Although the embodiment illustrated in FIG. 2A-2C shows an equal number of inductive bond wires for each inductive element 220, 320, and 420 (and hence, each number of bond wires in each bond wire group), the present disclosure is not limited thereto. In some embodiments, and as illustrated in FIG. 2B, the capacitance 122 may be provided as more than one capacitor 122A, 122B, although the present disclosure is not limited thereto.

Figure 3A:
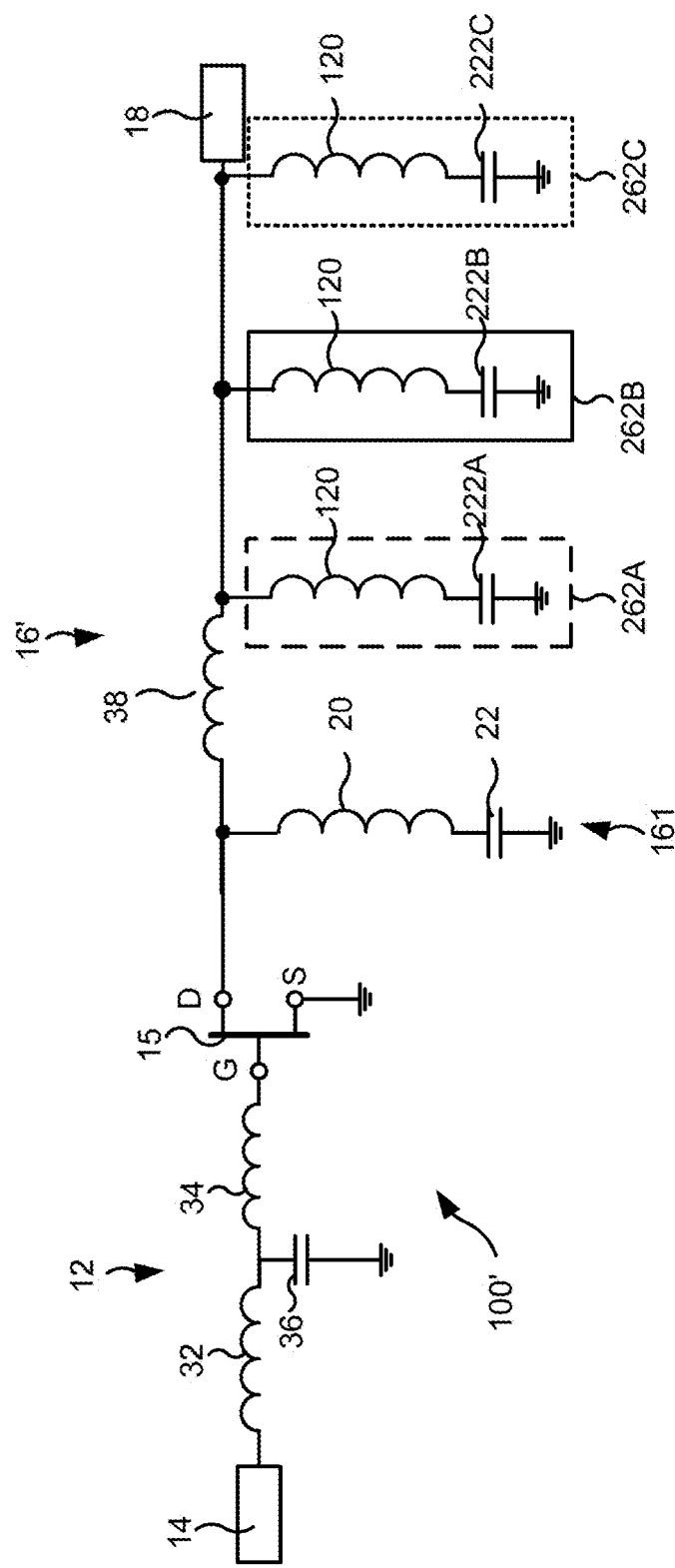
FIG. 3A is a schematic circuit diagram of an RF transistor amplifier according to further embodiments of the present invention.
Figure 3B:
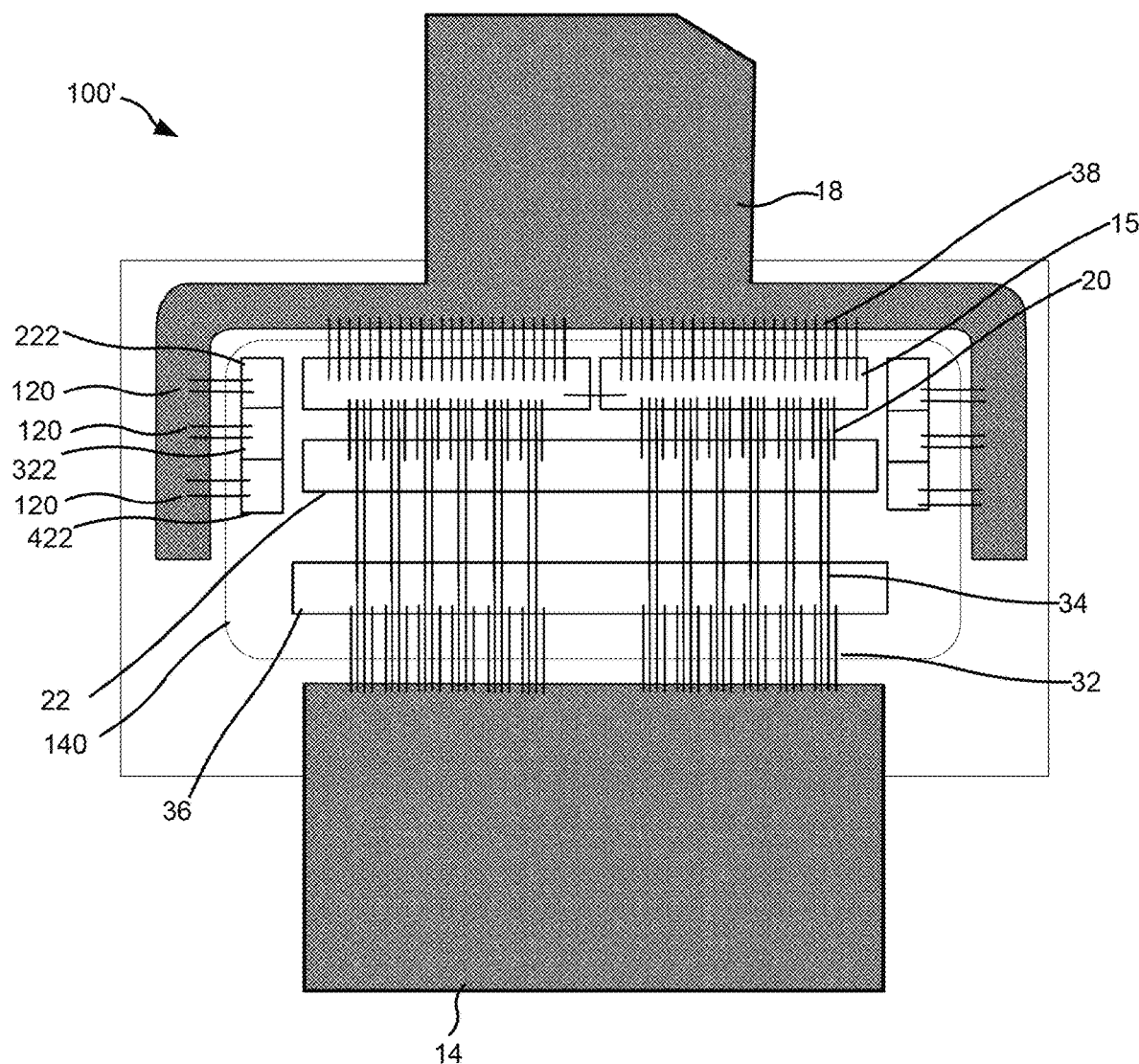
FIG. 3B is an example physical layout of the RF transistor amplifier that is illustrated in FIG. 3A.

FIG. 3A is a schematic circuit diagram of a RF transistor amplifier 100' according to further embodiments of the present invention that includes a transistor 15, an input circuit 12, and an output circuit 16'. FIG. 3B is an example physical layout of the RF transistor amplifier 100' that is illustrated in FIG. 3A.

The RF transistor amplifier 100' of FIGS. 3A and 3B may be similar to the RF transistor amplifier 100 of FIGS. 2A-2C, and elements identified with the same reference numerals may be similar to or identical to those previously discussed. The RF transistor amplifier 100' may differ in that the output circuit 16' of the embodiment illustrated in FIGS. 3A-3C may include three RF short/DC block circuits 262A, 262B, and 262C. Each of the RF short/DC block circuits 262A, 262B, and 262C may include a series LC resonator that includes respective capacitances 222A, 222B, and 222C, with the respective capacitances connected in series with identical inductive elements 120. The capacitances 222A, 222B, and 222C may have capacitance values that differ from each other. The capacitances 222A, 222B, and 222C may be implemented as a segmented capacitor 222 and/or may be implemented as individual or discrete capacitors. Each inductive element 120 may be configured to provide an identical inductance. Although the embodiment illustrated in FIGS. 3A-3B shows three RF short/DC block circuits, the present disclosure is not limited thereto, and there may be two, or more than three RF short/DC block circuits, each having a different capacitance.

The capacitance value of the capacitance 222 may be considered as a combined capacitance of multiple (N) small section capacitances $C_{section}$. Therefore, the total capacitance C may be considered $$C = \sum_{i=0}^{N} C_i$$

where N is the number of sections of the capacitance 222, and $C_i$ is the capacitance of each section of the capacitance 222.

If each $C_i$ is identical, and if each $L_i$ is identical, then each LC resonator (that is, each individual inductance $L_i$ in series with a respective capacitance $C_i$) has an identical resonant frequency:

$$f_{individual} = \frac{1}{2\pi \sqrt{L_i \times C_i}}$$

However, if the capacitances 222A, 222B, and 222C are designed with differing capacitance values, then each LC resonator, and thus each RF short/DC block circuit 262A, 262B, and 262C has a different capacitance, and a different resonant frequency.

$$f_A = \frac{1}{2\pi \sqrt{L \times C_A}}, f_B = \frac{1}{2\pi \sqrt{L \times C_B}}, \dots f_k = \frac{1}{2\pi \sqrt{L \times C_k}},$$

Thus, according to the present disclosure, by providing capacitances with different capacitance values, RF short/DC block circuits having different resonant frequencies may be provided.

Figure 4A:
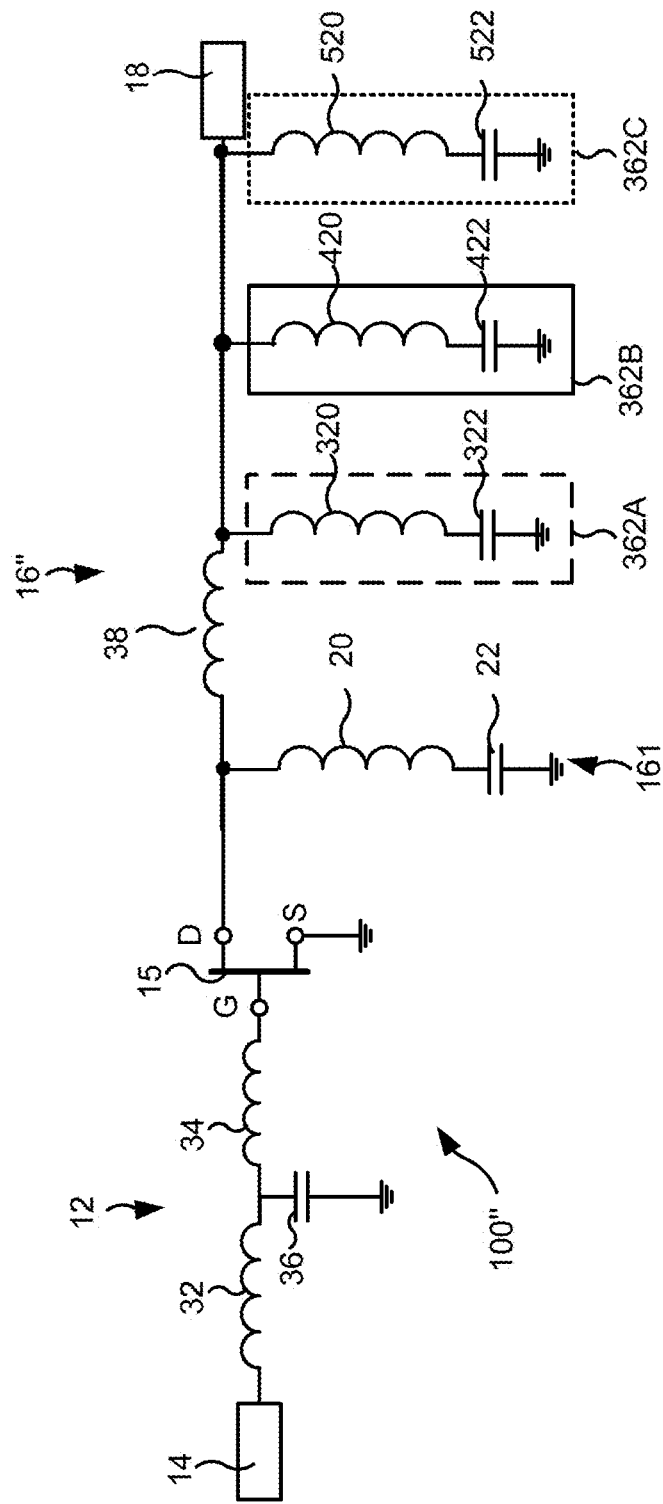
FIG. 4A is a schematic circuit diagram of an RF transistor amplifier according to still further embodiments of the present invention, such as the RF transistor amplifier of FIG. 1B.
Figure 4B:
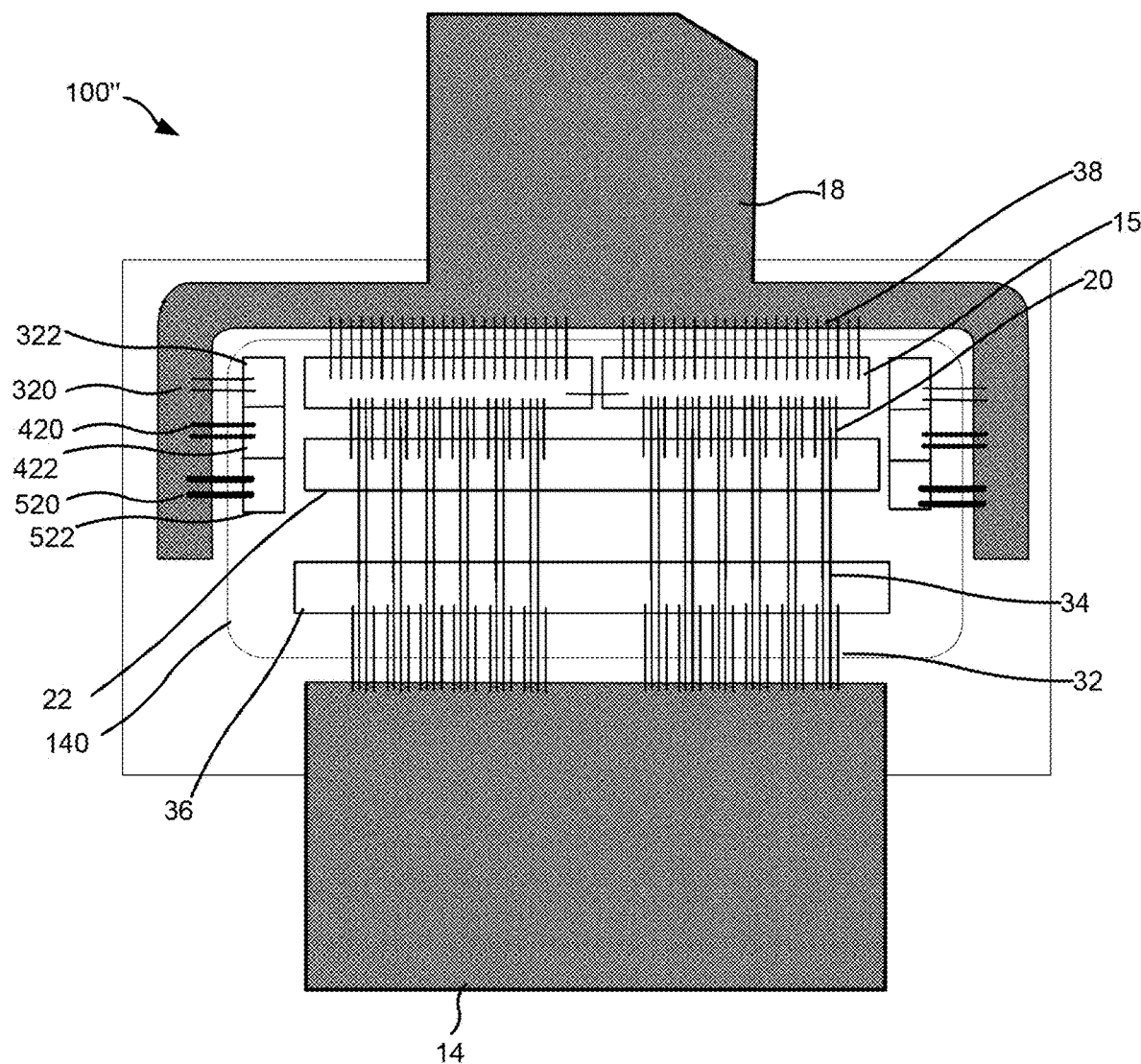
FIG. 4B is an example physical layout of the RF transistor amplifier that is illustrated in FIG. 4A.

FIG. 4A is a schematic circuit diagram of a RF transistor amplifier 100" according to still further embodiments of the present invention that includes a transistor 15, an input circuit 12, and an output circuit 16". FIG. 4B is an example physical layout of the RF transistor amplifier 100" that is illustrated in FIG. 4A.

The RF transistor amplifier 100" of FIGS. 4A and 4B may be similar to the RF transistor amplifier 100 of FIGS. 2A-2C, and elements identified with the same reference numerals may be similar to or identical to those previously discussed. The RF transistor amplifier 100" may differ in that the output circuit 16" of the embodiment illustrated in FIGS. 4A-4B may include three RF short/DC block circuits 362A, 362B, and 362C. Each of the RF short/DC block circuits 362A, 362B, and 362C may include a series LC resonator that includes respective different capacitances 322, 422, and 522, with the respective different capacitances connected in series with respective inductive elements 320, 420, and 520. The capacitances 322, 422, and 522 may have capacitance values that differ from each other. As discussed, the capacitances 322, 422, and 522 may be implemented as a segmented capacitor and/or may be implemented as individual or discrete capacitors. Each inductive element 320, 420, and 520 may provide inductive bond wires with different characteristics, such as different lengths, different cross-section shapes (e.g., profile or shape profile), different materials, and/or the like. Although the embodiment illustrated in FIGS. 4A-4B shows three RF short/DC block circuits, the present disclosure is not limited thereto, and there may be two, or more than three RF short/DC block circuits, each having a different capacitance and inductance.

Based on the equations already presented herein, it may be understood that if each $C_i$ is identical, and if each $L_i$ is identical, then each LC resonator (that is, each individual inductance $L_i$ in series with a respective capacitance $C_i$) has an identical resonant frequency:

$$f_{individual} = \frac{1}{2\pi\sqrt{L_i \times C_i}}$$

However, if the capacitances 322, 422, and 522 are designed with differing capacitance values, and if each inductive element 320, 420, and 520 is implemented via inductive bond wires having different characteristics, such as different lengths, different cross-section shapes (e.g., profile or shape profile), different materials, and/or the like, then each LC resonator, and thus each RF short/DC block circuit 362A, 362B, and 362C has a different capacitance and inductance, and hence a different resonant frequency.

$$f_A = \frac{1}{2\pi\sqrt{L_A \times C_A}}, f_B = \frac{1}{2\pi\sqrt{L_B \times C_B}}, \ldots f_m = \frac{1}{2\pi\sqrt{L_m \times C_m}},$$

Thus, according to the present disclosure, RF short/DC block circuits having different resonant frequencies may be provided by providing capacitances with different capacitance values in conjunction with providing inductive bond wires with different characteristics, such as different lengths, different cross-section shapes (e.g., profile or shape profile), different materials, and/or the like.

Figure 5:
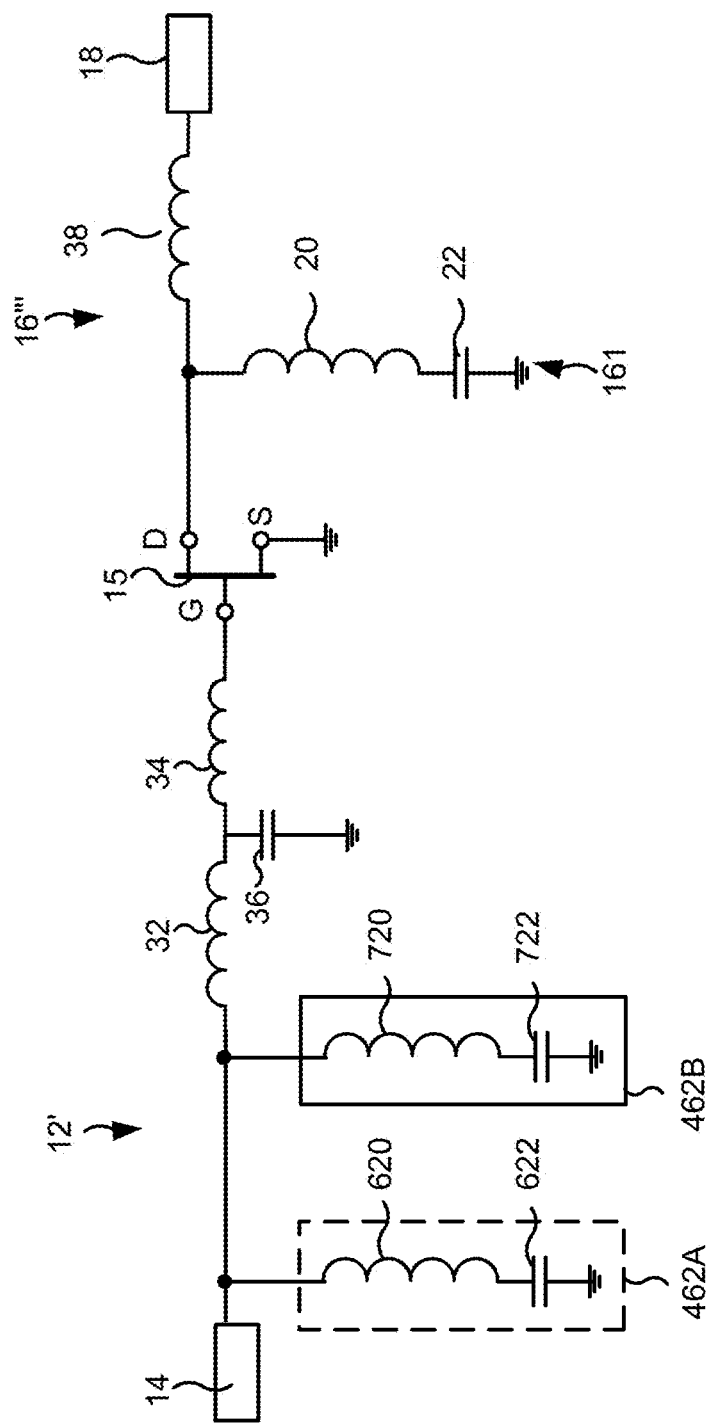
FIG. 5 is a schematic circuit diagram of an RF transistor amplifier according to additional embodiments of the present invention.

FIG. 5 is a schematic circuit diagram for a RF transistor amplifier 100''' according to still further embodiments of the present invention. In the embodiment of FIG. 5, the input circuit 12' that is connected between an input lead 14 and a gate G of the transistor 15 may include two RF short/DC block circuits 462A and 462B. Each of the RF short/DC block circuits 462A and 462B may include a series LC resonator that includes respective different capacitances 622 and 722, with the respective different capacitances connected in series with respective inductive elements 620 and 720. The capacitances 622 and 722 may have capacitance values that differ from each other. The capacitances 622 and 722 may be implemented as a segmented capacitor and/or may be implemented as individual or discrete capacitors. Each inductive element 620 and 720 may provide inductive bond wires with different characteristics, such as different lengths, different cross-section shapes (e.g., profile or shape profile), different materials, and/or the like. Although the embodiment illustrated in FIG. 5 shows two RF short/DC block circuits, the present disclosure is not limited thereto, and there may be more than two RF short/DC block circuits, each having a different capacitance and/or inductance.

Stated differently, FIG. 5 shows that an RF short/DC block circuit may be provided within the input circuit 12 of FIG. 1B, in addition to or alternatively from providing a RF short/DC block circuit 462 in the output circuit 16 of FIG. 1B. The RF short/DC block circuit provided in the input circuit 12 may be similar to any of the RF short/DC block circuits 162, 262, or 362 herein. In other words, the RF short/DC block circuit included in the input circuit 12 may have more than one resonant frequency arising from a plurality of LC resonators having differing inductances included therein. The differing inductances may be provided by inductive bond wires with different characteristics, such as different lengths, different cross-section shapes (e.g., profile or shape profile), different materials, and/or the like. In some embodiments, the RF short 462 of the input circuit 12 may have more than one resonant frequency arising from the plurality of LC resonators of the RF short/DC block circuit 462 having different capacitive values. In some embodiments, the RF short/DC block circuit 462 of the input circuit 12 may have more than one resonant frequency arising from the plurality of LC resonators of the RF short 462 having different capacitive values and different inductances. Any of the RF short/DC block circuits 462 discussed herein with respect to FIG. 5 may be implemented in conjunction with any of the RF transistor amplifiers 100, 100', and 100" of FIGS. 2A-4B, without exception.

Figure 6A:
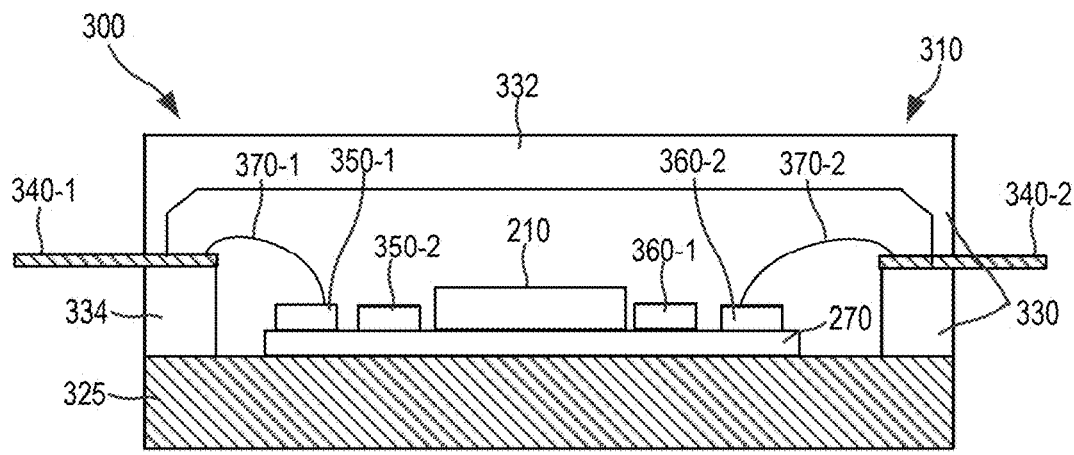
FIG. 6A is a schematic cross-sectional view of a packaged RF transistor amplifier according to embodiments of the present invention that includes a ceramic package.
Figure 6B:
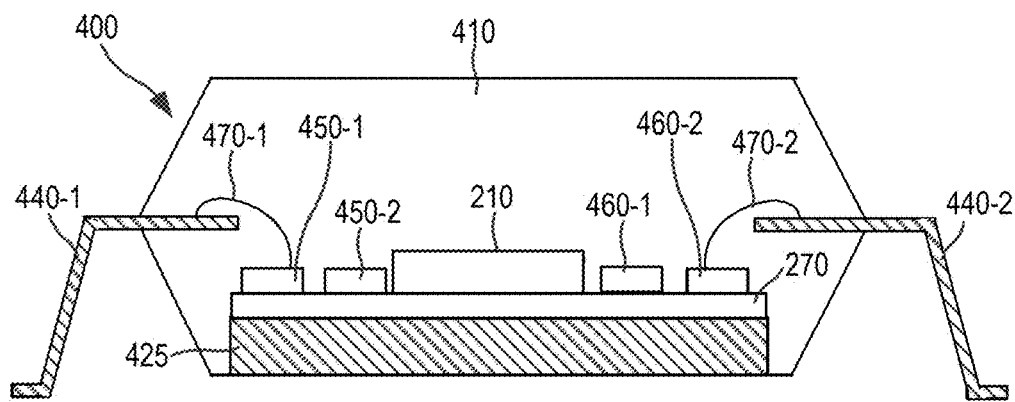
FIG. 6B is a schematic cross-sectional view of a packaged RF transistor amplifier according to embodiments of the present invention that includes an overmold plastic package.
Figure 6C:
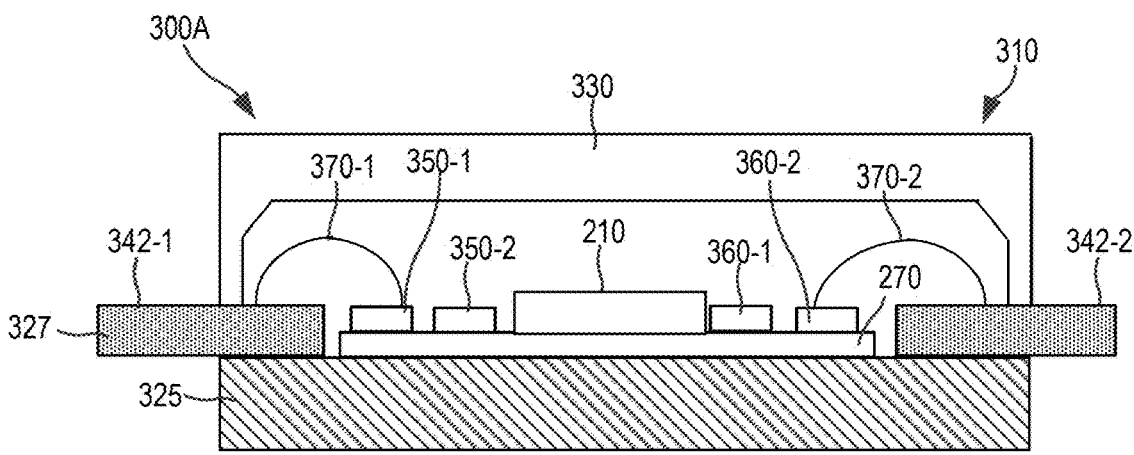
FIG. 6C is a schematic cross-sectional view of a packaged RF transistor amplifier according to embodiments of the present invention that includes a printed circuit board based package.

Although the present disclosure is not limited thereto, in some embodiments the RF transistor amplifiers 100, 100', 100", and 100''' may incorporate an air cavity or may be formed within a plastic overmold that is used to encase the components of the RF transistor amplifiers. In some embodiments the base 140 of the RF transistor amplifiers may be or may include a printed circuit board (PCB). FIGS. 6A-6C provide examples of such packaged RF transistor amplifiers according to embodiments of the present invention.

In particular, FIG. 6A is a schematic cross-sectional view of a packaged RF transistor amplifier 300 that may include any of the RF transistor amplifiers 100, 100', 100", or 100''' (which are generically designated as 210 in FIG. 6A) in an open cavity package. As shown in FIG. 6A, the open-cavity package 310 includes a base 325, such as a metal flange, and an upper housing 330 which may include, for example, sidewalls 332 and a lid 334. In an example embodiment, the base 325 may be a multilayer copper/molybdenum/copper metal flange that comprises a core molybdenum layer with copper cladding layers on either major surface thereof. The ceramic sidewalls 332 and lid 334 may be formed of, for example, $Al_2O_3$. The ceramic lid 334 may be glued to the ceramic sidewalls 332 using an epoxy glue. The ceramic sidewalls 332 may be attached to the metal base 325 via braising. The RF transistor amplifier 210 (which may be any of the RF transistor amplifiers 100, 100', 100", or 100''' provided herein) may, for example, be mounted on an interconnection structure 270 using, for example, conductive contacts, such as bumps (not shown) and the interconnection structure 270 is mounted on the base 325 using, for example, a conductive die attach material. The base 325 may dissipate heat carried through the heat dissipation structures 290 in interconnection structure 270 outside of ceramic package 310.

Additional components 350, 360 are mounted on the interconnection structure 270. These additional components may include, for example, input matching components 350 and output matching components 360 that are used to impedance match at the fundamental frequency and/or to terminate harmonics to ground. The matching components 350, 360 may be passive RF components that include resistors, capacitors and/or inductors that are implemented (at least partially) in integrated passive devices or printed circuit boards, for example. Conductive leads 340 extend through the housing 310 to allow the packaged RF transistor amplifier 300 to be connected to external devices/circuits/power sources. In the depicted embodiment, wire bonds 370 are used to connect the conductive leads 340 to passive RF components 350, 360 on the interconnection structure 270. It will be appreciated, however, that the wire bonds 370 may be omitted in other embodiments and different electrical connections ay be used. An RF signal input to the RF transistor amplifier 300 on a first lead 340-1 may be passed through the wire bond 370-1 to input matching circuits 350 and from there to an input of the RF transistor amplifier 210, and the amplified output RF signal may be passed from the output of the RF transistor amplifier 210 to the output matching circuits 360 and from there to the bond wire 370-2 where the RF signal is output through lead 340-2. As discussed above, in some embodiments input matching components 350 and output matching components 360 may be provided within the RF transistor amplifier 210 as part of input circuit 12 and output circuit 16, respectively.

FIG. 6B is a schematic cross-sectional view of a packaged RF transistor amplifier 400 that includes any one of the RF transistor amplifiers 100, 100', 100", or 100'" in an overmold plastic package. As shown in FIG. 6B, the packaged RF transistor amplifier 400 includes a base 425, such as a metal heat sink that is part of a lead frame or metal slug, that is at least partially surrounded by a plastic overmold 410. The RF transistor amplifier 210 (which may be any of RF transistor amplifiers 100, 100', 100", or 100'") is mounted on an interconnection structure 270 using, for example, conductive bumps (not shown), and the interconnection structure 270 is mounted on the base 425. The base 425 may comprise, for example, a metal base that may dissipate heat carried through heat dissipation structures (not shown) in interconnection structure 270. Additional components 450, 460 are mounted on the interconnection structure 270. These additional components may include, for example, input matching components 450 and output matching components 460 that are used to impedance match at the fundamental frequency and/or to terminate intermodulation products to ground. As discussed above, these matching components may be passive RF components that include resistors, capacitors and/or inductors that are implemented (at least partially) in integrated passive devices or printed circuit boards, for example. Conductive leads 440 extend through the plastic overmold 410 to allow the RF transistor amplifier 400 to be connected to external devices/circuits/power sources. In the depicted embodiment, wire bonds 470 are used to connect the conductive leads 440 to the passive RF components 450, 460 on the interconnection structure 270, although the wire bonds 470 may be omitted in other embodiments.

FIG. 6C is a schematic cross-sectional view of a packaged RF transistor amplifier 300A that includes one of the RF transistor amplifiers 100, 100', 100", or 100'" in a printed circuit board based package. The packaged RF transistor amplifier 300A is very similar to the packaged RF transistor amplifier 300 discussed above with reference to FIG. 6A, except that the leads 340-1, 340-2 of packaged RF transistor amplifier 300 are replaced with a printed circuit board 327 that includes traces 342-1, 342-2 that act as the input and output leads. The printed circuit board 327 may be attached to the metal base 325 via, for example, a conductive glue. The printed circuit board 327 includes a central opening and the interconnection structure 270 is mounted within this opening on the base (e.g., metal flange) 325. The RF transistor 210 and the matching networks 350-1, 350-2, 360-1, 360-2 are mounted on the interconnection structure 270.

It will be appreciated that any of the RF transistor amplifiers according to embodiments of the present invention that are discussed herein may be mounted in packages such as the open cavity and overmold packages shown in FIGS. 6A through 6C. Thus, the RF transistor 210 and interconnection structures 270 shown in FIGS. 6A-6C may be replaced with the RF transistor and interconnection structures according to any of the embodiments of the present invention that are discussed herein to provide many further embodiments of packaged RF transistor amplifiers. Depending on the embodiment, the packaged RF transistor amplifier can include a monolithic microwave integrated circuit (MMIC) as the RF transistor amplifier where the RF transistor amplifier incorporates multiple discrete circuits in a single integrated die. Additionally and/or alternatively, the package can comprise multiple RF transistor amplifiers in a path that are connected in series to form a multiple stage RF transistor amplifier and/or multiple RF transistor amplifiers that are disposed in multiple paths (e.g., in parallel) to form an RF transistor amplifier with multiple transistor amplifier die and multiple paths, such as in a Doherty amplifier configuration. In some embodiments, the packaged RF transistor amplifier may include RF transistor amplifiers according to embodiments of the present invention that has an output circuit that includes a plurality of LC resonators configured collectively to attenuate across a frequency band, with different LC resonators of the output circuit configured to resonate at different frequencies, as well as traditional RF transistor amplifiers in which a narrower attenuation is provided.

Figure 7:
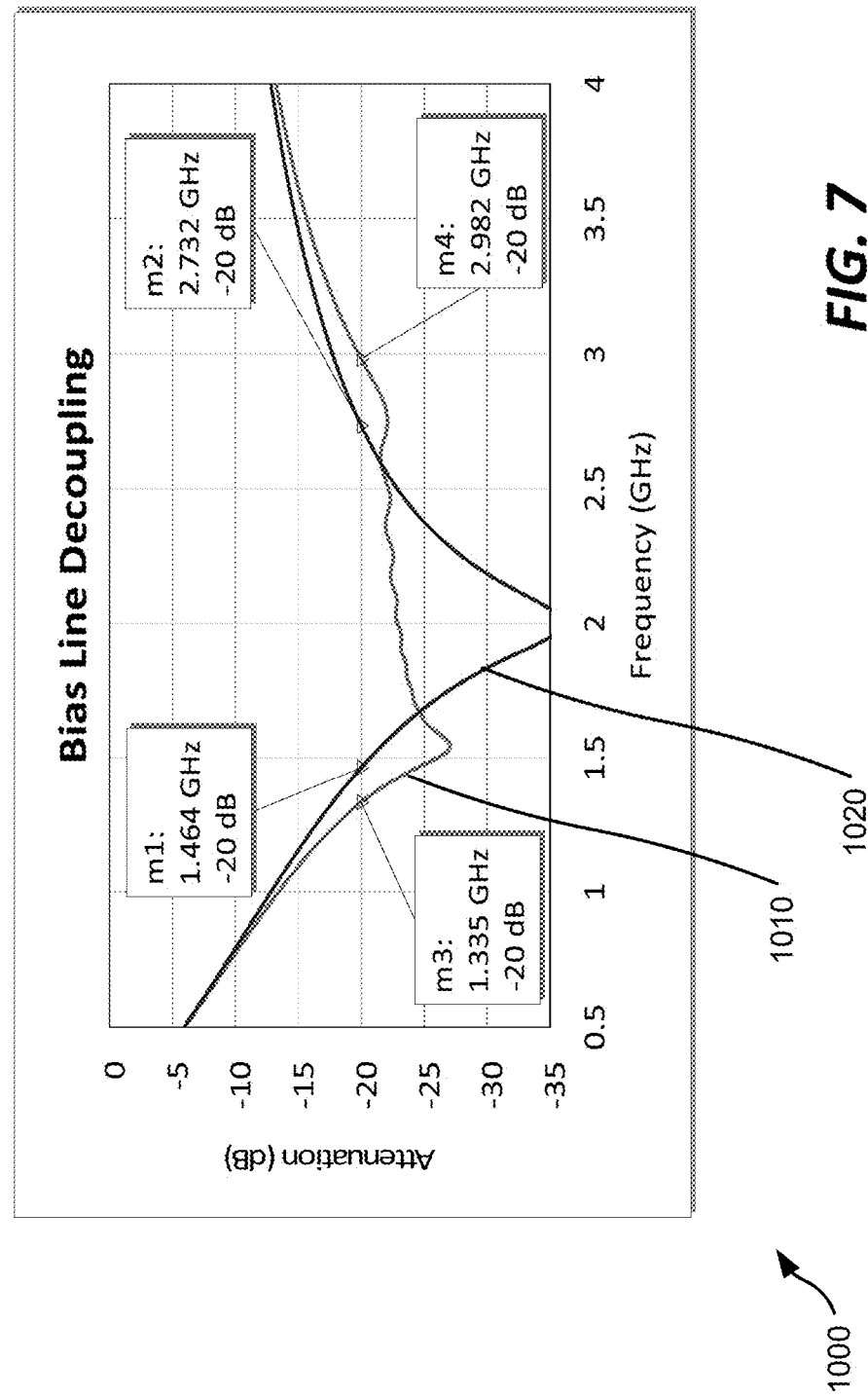
FIG. 7 is a graph of a simulated output illustrating an attenuation response of a RF transistor amplifier similar to those provided herein.

FIG. 7 graphically illustrates an output 1000 of a simulation of an RF transistor amplifier similar to RF transistor amplifier 100 discussed with reference to FIGS. 2A-2C. Curve 1010 illustrates an attenuation capability (i.e., how much the RF short/DC block circuit attenuates RF signals as a function of frequency) of a device with different bond wire groups (e.g., different inductive elements similar to inductive elements 220, 320, and 420), and curve 1020 illustrates an attenuation capability of a device without such different bond wire groups. The amplifier represented by curve 1020 has a narrower response range, providing −20 dB attenuation or greater from 1.464 GHz to 2.732 GHz. The amplifier represented by curve 1010 has a broader response range and is configured to attenuate across a frequency band centered around approximately 2 GHz, providing −20 dB attenuation or greater from 1.335 GHz to 2.982 GHz.

As can be seen from the graphical illustration of FIG. 7, according to embodiments of the present invention, an output circuit of an RF transistor amplifier can be configured to attenuate RF signals across a frequency band centered around a central frequency (e.g., 2 GHz in the illustration of FIG. 7). The output circuit may include a plurality of inductance-capacitance (LC) resonators, each coupled to an output of the RF transistor amplifier, and each configured to resonate at a respective different frequency. For example, one resonator may be configured to resonate at a frequency below the central frequency, and a second resonator may be configured to resonate at a frequency above the central frequency. Embodiments of the present invention may thus provide attenuation over a wider frequency band than previous RF transistor amplifiers in which attenuation is provided for only certain frequencies, such as harmonics.

Embodiments of the present invention may be used in circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz). As such, embodiments of the present invention may be used to address an increasing demand for RF transistor amplifiers that are used to amplify RF signals at frequencies of, for example, 500 MHz and higher (including microwave frequencies).

Embodiments of the present invention may include RF transistor amplifiers implemented in silicon or wide bandgap semiconductor materials, such as silicon carbide ("SiC") and/or Group III nitride materials. As used herein, the term "Group III nitride" refers to those semiconducting compounds formed between nitrogen and the elements in Group III of the periodic table, usually aluminum (Al), gallium (Ga), and/or indium (In). The term may also refer to ternary and quaternary compounds, such as AlGaN and AlInGaN. These compounds have empirical formulas in which one mole of nitrogen is combined with a total of one mole of the Group III elements. Some RF transistor amplifiers according to embodiments of the present invention may be implemented using Group III nitride-based RF transistor amplifier die. Such embodiments may be implemented as High Electron Mobility Transistors ("HEMT"). Other embodiments of the present invention may include silicon-based RF transistor amplifiers implemented using laterally diffused metal oxide semiconductor ("LDMOS") transistors. Silicon LDMOS RF transistor amplifiers can exhibit high levels of linearity and may be relatively inexpensive to fabricate, while Group III nitride-based RF transistor amplifier may be used in applications requiring high power and/or high frequency operation where LDMOS RF transistor amplifiers may have inherent performance limitations.

Embodiments of the present invention may include RF transistor amplifiers having one or more amplification stages, with each stage implemented as a transistor amplifier. In some embodiments, the RF transistor amplifiers may be implemented as a single integrated circuit chip or "die," or may include a plurality of dies. When multiple RF transistor amplifier die are used, they may be connected in series and/or in parallel.

As discussed above, embodiments of the present invention may include RF transistor amplifiers having matching circuits, such as (1) impedance matching circuits configured to improve the impedance match (for RF signals at the fundamental operating frequency of the amplifier) between the RF transistor amplifier die and transmission lines connected thereto and (2) harmonic termination circuits that are designed to at least partly terminate harmonics that may be generated during device operation, such as second and third order harmonics.

Figure 11A:
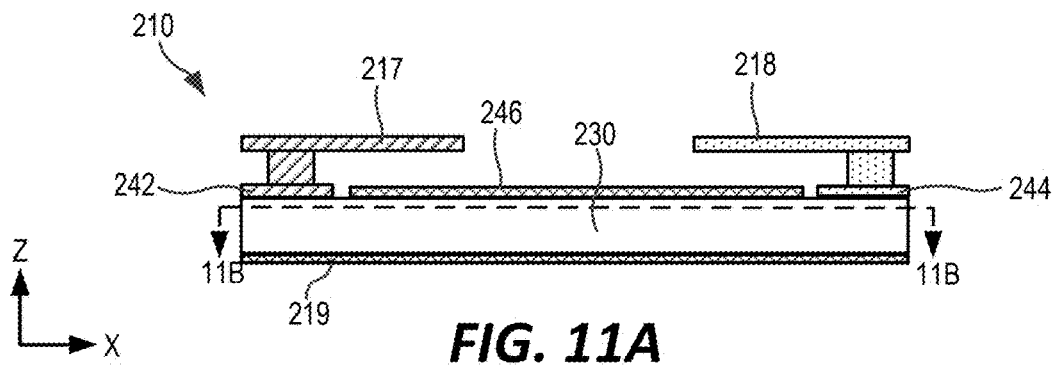
FIG. 11A is a schematic side view of a Group III nitride-based RF transistor amplifier according to some embodiments of the present invention.
Figure 11B:
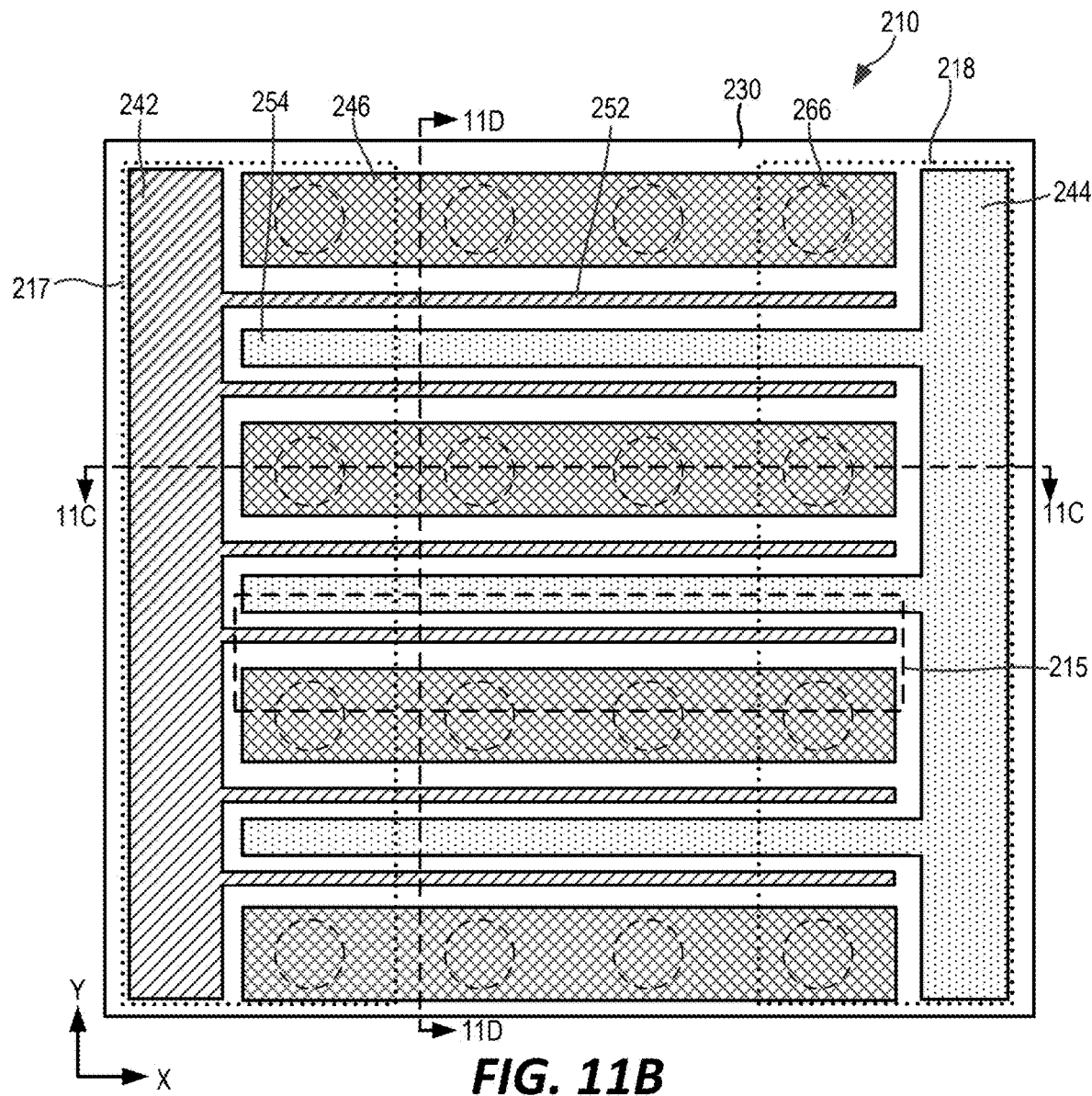
FIG. 11B is a schematic cross-sectional view of an RF transistor amplifier die that is part of the Group III nitride-based RF transistor amplifier of FIG. 11A, taken along line 11B-11B of FIG. 11A.
Figure 11C:
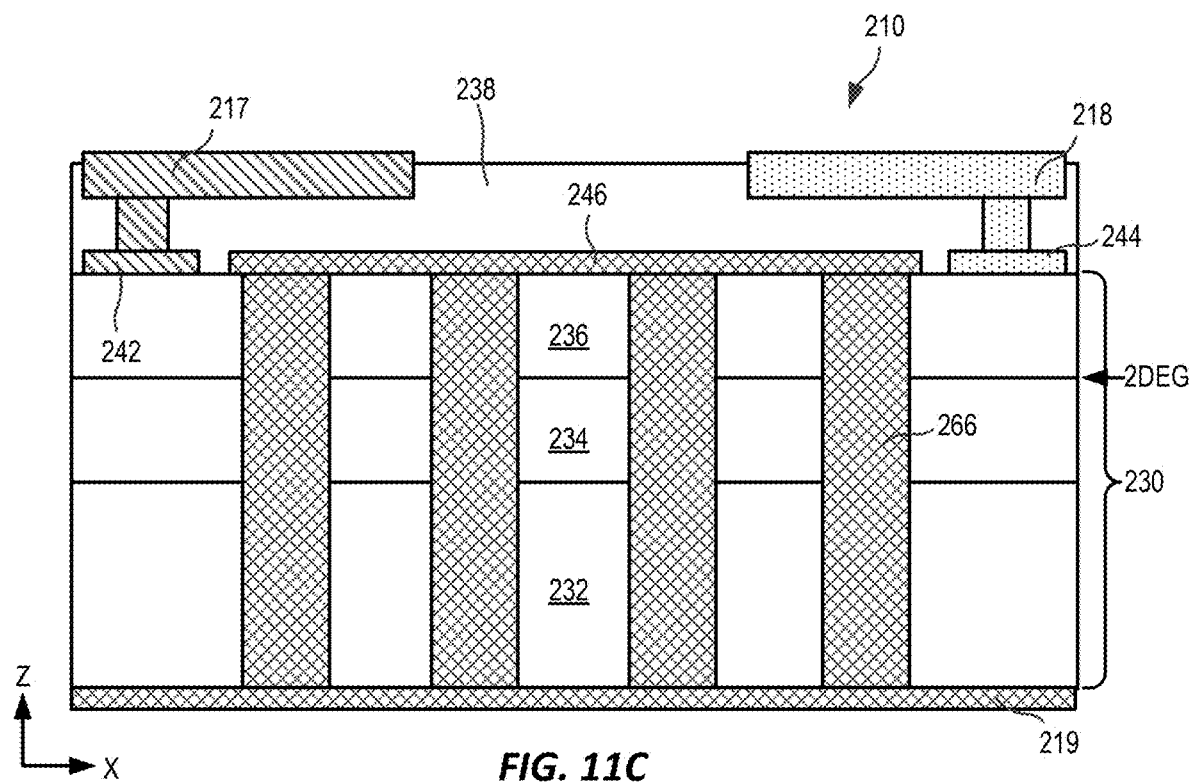
FIG. 11C is a cross-sectional view taken along line 11C-11C of FIG. 11B.
Figure 11D:
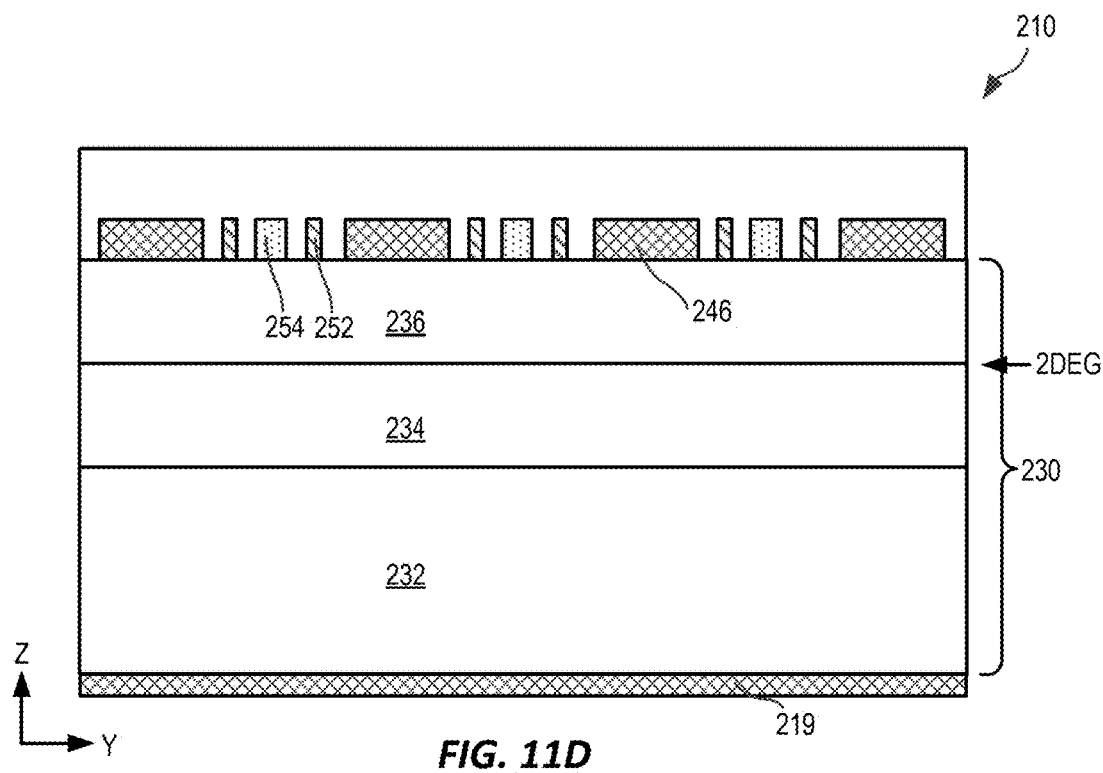
FIG. 11D is a cross-sectional view taken along line 11D-11D of FIG. 11B.

FIGS. 11A-11D depict a Group III nitride-based RF transistor amplifier die 210 that may be used in the RF transistor amplifiers according to certain embodiments of the present invention. In particular, FIG. 11A is a schematic plan view of the Group III nitride-based RF transistor amplifier die 210, and FIG. 11B is a schematic horizontal cross-sectional view of the RF transistor amplifier die 210 that is taken just above a semiconductor layer structure thereof. FIGS. 11C and 11D are schematic cross-sectional views of the RF transistor amplifier die 210 that are taken along lines 11C 11C and 11D 11D of FIG. 11B, respectively.

As shown in FIG. 11A, the Group III nitride-based RF transistor amplifier die 210 includes a gate terminal 217 and a drain terminal 218 that are provided on a top side 212 of the RF transistor amplifier die 210. A protective insulating layer 216 may cover the remainder of the top surface of the RF transistor amplifier die 210. A source terminal 219 (FIGS. 11C-11D) is provided on the back side 214 of the RF transistor amplifier die 210.

The RF transistor amplifier 200 may be a HEMT-based RF transistor amplifier that has a semiconductor layer structure 230. FIG. 11B illustrates the metal layers that are formed directly on the semiconductor layer structure 230 to form the HEMT devices. As shown in FIG. 11B, the RF transistor amplifier die 210 includes a gate manifold 242 and a drain manifold 244, a plurality of gate fingers 252, a plurality of drain fingers 254 and a plurality of source fingers 246, all of which may be formed on an upper surface of the semiconductor layer structure 230. The gate manifold 242 and the gate fingers 252 may be implemented as a first monolithic metal pattern, but the present invention is not limited thereto. The gate fingers 252 may be formed of materials that are capable of making a Schottky contact to a Group III nitride-based semiconductor material, such as Ni, Pt, Cu, Pd, Cr, W, and/or WSiN. The drain manifold 244 and drain fingers 254 may be implemented as a second monolithic metal pattern. The drain fingers 254 may include a metal, such as TiAlN, that can form an ohmic contact to Group III nitride-based materials. The source fingers 246 may likewise comprise a metal that can form an ohmic contact to Group III nitride-based materials, and may be electrically connected to the source terminal 219 via a plurality of source vias 266 that extend through the semiconductor layer structure 230. A dielectric layer (or a series of dielectric layers) that help isolate the gate manifold/fingers 242, 252, the drain manifold/fingers 244, 254 and the source fingers 246 from each other is not shown in FIG. 11B to better illustrate the elements of the RF transistor amplifier die 210.

The RF transistor amplifier die 210 includes a plurality of unit cell transistors 215 that are electrically connected to each other in parallel. As shown, each unit cell transistor 215 includes a gate finger 252, a drain finger 254, and a source finger 246 along with the underlying portion of the semiconductor layer structure 230.

As shown in FIGS. 11C-11D, the semiconductor layer structure 230 includes a plurality of semiconductor layers. The semiconductor layer structure 230 may include at least a channel layer 234 and a barrier layer 236 that is on a top side of the channel layer 234, and may include additional semiconductor and/or non-semiconductor layers. For example, the semiconductor layer structure 230 may include a growth substrate 232 on which the other semiconductor layers are grown. The growth substrate 232 may comprise, for example, a 4H-SiC or 6H-SiC substrate. In other embodiments, the growth substrate 232 may comprise a different semiconductor material (e.g., a Group III nitride-based material, Si, GaAs, ZnO, InP) or a non-semiconductor material (e.g., sapphire). SiC growth substrates 232 may have a much closer crystal lattice match to Group III nitrides than sapphire or silicon, and this closer lattice match may result in Group III nitride films of higher quality than those generally available on sapphire or silicon. SiC also has a very high thermal conductivity, facilitating heat dissipation from the RF amplifier die 210, and the availability of semi-insulating SiC substrates may provide for device isolation and reduced parasitic capacitance.

Optional buffer, nucleation, and/or transition layers (not shown) may be provided on the growth substrate 232 beneath the channel layer 234. For example, an AlN buffer layer may be included to provide an appropriate crystal structure transition between a SiC growth substrate 232 and the remainder of the semiconductor layer structure 230. Additionally, strain balancing transition layer(s) or other layers may also be provided.

The channel layer 234 may be a Group III nitride material, such as $Al_xGa_{1-x}N$ where $0 \leq x < 1$, provided that the energy of the conduction band edge of the channel layer 234 is less than the energy of the conduction band edge of the barrier layer 236 at the interface between the channel and barrier layers 234, 236. In certain embodiments, x=0, indicating that the channel layer 234 is gallium nitride ("GaN"). The channel layer 234 may also be other Group III nitrides such as InGaN, AlInGaN or the like. The channel layer 234 may be undoped or unintentionally doped and may be grown to a thickness of, for example, greater than about 2 nm. The channel layer 234 may also be a multi-layer structure, such as a superlattice or combinations of GaN, AlGaN or the like.

The channel layer 234 may have a bandgap that is less than the bandgap of at least a portion of the barrier layer 236, and the channel layer 234 may also have a larger electron affinity than the barrier layer 236. In certain embodiments, the barrier layer 236 is AlN, AlInN, AlGaN or AlInGaN with a thickness of between about 0.1 nm and about 10 nm or more. In particular embodiments, the barrier layer 236 is thick enough and has a high enough Al composition and doping to induce a significant carrier concentration at the interface between the channel layer 234 and the barrier layer 236.

The barrier layer 236 may be a Group III nitride and may have a bandgap larger than that of the channel layer 234 and a smaller electron affinity than the channel layer 234. Accordingly, in certain embodiments of the present invention, the barrier layer 236 may include AlGaN, AlInGaN and/or AlN or combinations of layers thereof. The barrier layer 236 may, for example, be from about 0.1 nm to about 30 nm thick. In certain embodiments, the barrier layer 236 is undoped or doped with an n-type dopant to a concentration less than about $10^{19}$ cm$^{-3}$. In some embodiments of the present invention, the barrier layer 236 is $Al_xGa_{1-x}N$ where $0<x<1$. In particular embodiments, the aluminum concentration is about 25%. However, in other embodiments of the present invention, the barrier layer 236 comprises AlGaN with an aluminum concentration of between about 5% and about 100%.

Due to the difference in bandgap between the barrier layer 236 and the channel layer 234 and piezoelectric effects at the interface between the barrier layer 236 and the channel layer 234, a two dimensional electron gas (2DEG) is induced in the channel layer 234 at a junction between the channel layer 234 and the barrier layer 236. The 2DEG acts as a highly conductive layer that allows conduction between a source region of each unit cell transistor 215 and its associated drain region, where the source region is the portion of the semiconductor layer structure 230 that is directly underneath the source finger 246 and the drain region is the portion of the semiconductor layer structure 230 that is directly underneath the corresponding drain finger 254.

As is further shown in FIGS. 11C-11D, the gate terminal 217 and the drain terminal 218 may be provided on the upper surface of the RF transistor amplifier die 210. The gate terminal 217 may be physically and electrically connected to the gate manifold 242 (e.g., by conductive pillars), and the drain terminal 218 may be physically and electrically connected to the drain manifold 244 (e.g., by conductive pillars).

While FIGS. 11A-11D illustrate one example embodiment of a Group III nitride-based RF transistor amplifier die, it will be appreciated that a wide variety of other Group III nitride-based RF transistor amplifier die may alternatively be used. In other embodiments, silicon LDMOS RF transistor amplifier die may be used.

Aspects of the present disclosure have been described above with reference to the accompanying drawings, in which examples of embodiments of the inventive concepts are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A radio frequency (RF) transistor amplifier, comprising:
   a transistor on a base of the RF transistor amplifier and coupled to an input and an output of the RF transistor amplifier;
   a first inductance-capacitance (LC) resonator comprising a first inductance and a first capacitance; and
   a second LC resonator comprising a second inductance and a second capacitance; and
   a third inductance having a first end coupled to the transistor and a second end coupled to the first and second LC resonators,
   wherein the first LC resonator is configured to resonate at a first frequency, and the second LC resonator is configured to resonate at a second frequency different from the first frequency, and
   wherein the first LC resonator and the second LC resonator are both coupled to either the input or the output of the RF transistor amplifier.

2. The RF transistor amplifier of claim 1, wherein the first inductance comprises a first bond wire and wherein the second inductance comprises a second bond wire.

3. The RF transistor amplifier of claim 2, wherein the first bond wire and the second bond wire are different in length, profile, and/or cross-sectional area.

4. The RF transistor amplifier of claim 2, wherein the first bond wire and the second bond wire have different cross-section shapes.

5. The RF transistor amplifier of claim 2, wherein the first bond wire comprises a first value for a selected characteristic, and wherein the second bond wire comprises a second value for the selected characteristic that is different from the first value.

6. The RF transistor amplifier of claim 1, wherein the first capacitance comprises a capacitance value that differs from a capacitance value of the second capacitance.

7. The RF transistor amplifier of claim 6, wherein the first inductance is equal to the second inductance.

8. The RF transistor amplifier of claim 6, wherein the first inductance comprises a first bond wire and wherein the second inductance comprises a second bond wire, and wherein the first bond wire and the second bond wire are different in length, material, profile, and/or cross-sectional area.

9. The RF transistor amplifier of claim 8, wherein the first bond wire and the second bond wire have different cross-section shapes.

10. The RF transistor amplifier of claim 1, wherein the first inductance is different from the second inductance, and wherein the first capacitance is equal to the second capacitance.

11. The RF transistor amplifier of claim 1, comprising a plurality of LC resonators each coupled to the input or output of the RF transistor amplifier, the plurality of LC resonators including the first and second LC resonators, wherein the plurality of LC resonators are configured collectively to attenuate RF signals across a frequency band.

12. The RF transistor amplifier of claim 11, wherein the first frequency is below a central frequency of the frequency band, and wherein the second frequency is above the central frequency of the frequency band.

13. A radio frequency (RF) transistor amplifier, comprising:
    a transistor on a base of the RF transistor amplifier and coupled to an input lead and an output lead of the RF transistor amplifier;
    a first inductance-capacitance (LC) resonator comprising a first set of inductive bond wires extending between the input lead or the output lead and a first capacitance; and
    a second LC resonator comprising a second set of inductive bond wires extending between the input lead or the output lead and a second capacitance;
    wherein the first LC resonator is configured to resonate at a first frequency, and the second LC resonator is configured to resonate at a second frequency different from the first frequency, and
    wherein the first LC resonator and the second LC resonator are coupled in parallel between the input lead or the output lead of the RF transistor amplifier and ground.

14. The RF transistor amplifier of claim 13, wherein the first set of inductive bond wires and the second set of inductive bond wires are different in length, material, profile, and/or cross-sectional area.

15. The RF transistor amplifier of claim 13, comprising a plurality of LC resonators each coupled to the input lead or output lead of the RF transistor amplifier, the plurality of LC resonators including the first and second LC resonators, wherein the plurality of LC resonators are configured collectively to attenuate RF signals across a frequency band.

16. The RF transistor amplifier of claim 15, wherein the first frequency is below a central frequency of the frequency band, and wherein the second frequency is above the central frequency of the frequency band.

17. A radio frequency (RF) transistor amplifier, comprising:
    a transistor on a base of the RF transistor amplifier and coupled to an input and an output of the RF transistor amplifier; and
    an output circuit configured to attenuate RF signals across an output frequency band, wherein the output circuit comprises a plurality of inductance-capacitance (LC) resonators, each coupled to the output of the RF transistor amplifier, and each configured to resonate at a respective different frequency,
    wherein a first LC resonator of the plurality of LC resonators is configured to resonate at a first frequency below a central frequency of the output frequency band, and wherein a second LC resonator of the plurality of LC resonators is configured to resonate at a second frequency above the central frequency of the output frequency band.

18. The RF transistor amplifier of claim 17, wherein each LC resonator comprises a respective set of inductive bond wires.

19. The RF transistor amplifier of claim 18, wherein the inductive bond wires of each set of inductive bond wires differs in length, material, profile, and/or cross-sectional area from the inductive bond wires of the other sets of inductive bond wires.

20. The RF transistor amplifier of claim 1, wherein the third inductance is coupled to a drain of the transistor, further comprising a harmonic reducer coupled between the drain of the transistor and the third inductance.

* * * * *